United States Patent
Lee et al.

(10) Patent No.: US 9,564,327 B2
(45) Date of Patent: *Feb. 7, 2017

(54) METHOD FOR FORMING LINE END SPACE STRUCTURE USING TRIMMED PHOTO RESIST

(71) Applicant: Taiwan Semiconductor Manufacturing Company Limited, Hsin-Chu (TW)

(72) Inventors: Chia-Ying Lee, New Taipei (TW); Jyu-Horng Shieh, Hsin-Chu (TW); Ming-Feng Shieh, Yongkang (TW); Shih-Ming Chang, Zhubei (TW); Chih-Ming Lai, Hsinchu (TW); Ken-Hsien Hsieh, Taipei (TW); Ru-Gun Liu, Zhubei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/720,875

(22) Filed: May 25, 2015

(65) Prior Publication Data

US 2015/0255283 A1    Sep. 10, 2015

Related U.S. Application Data

(63) Continuation of application No. 14/479,404, filed on Sep. 8, 2014, now Pat. No. 9,040,433, which is a
(Continued)

(51) Int. Cl.
  *H01L 21/033*    (2006.01)
  *H01L 21/02*    (2006.01)
(Continued)

(52) U.S. Cl.
  CPC ......... *H01L 21/0337* (2013.01); *G03F 7/0035* (2013.01); *H01L 21/02274* (2013.01);
(Continued)

(58) Field of Classification Search
  CPC ............. H01L 21/0337; H01L 21/0332; H01L 21/0335; H01L 21/02274; H01L 21/31144; H01L 21/76816; H01L 21/033; H01L 21/31; H01L 21/02; G03F 7/0035; G03F 7/167
  See application file for complete search history.

(56) References Cited

U.S. PATENT DOCUMENTS 7,015,148 B1    3/2006    Lukanc et al.
8,318,598 B2 *    11/2012    Beyer ............... H01L 21/76816
                                                         257/E21.577
(Continued)

FOREIGN PATENT DOCUMENTS

JP    2012199360 A    10/2012
TW    200910419       3/2009

OTHER PUBLICATIONS

Corresponding Taiwan Notice of Allowance dated Aug. 3, 2015, 3 pages.

*Primary Examiner* — Scott B Geyer
(74) *Attorney, Agent, or Firm* — Cooper Legal Group, LLC

(57) ABSTRACT

One or more techniques or systems for forming a line end space structure are provided herein. In some embodiments, a first patterned second hard mask (HM) region is formed above a first HM region. Additionally, at least some of the first patterned second HM region is removed. In some embodiments, a first sacrificial HM region and a second sacrificial HM region are formed above at least one of the first patterned second HM region or the first HM region. Photo resist (PR) is patterned above the second sacrificial (Continued)

HM region, and a spacer region is deposited above the patterned PR and second sacrificial HM region. In some embodiments, at least some of at least one of the spacer region, the PR, or the respective sacrificial HMs is removed. In this way, a line end space structure associated with an end-to-end space is formed.

20 Claims, 23 Drawing Sheets

Related U.S. Application Data continuation of application No. 13/734,231, filed on Jan. 4, 2013, now Pat. No. 8,828,885.

(51) Int. Cl.
- *H01L 21/311* (2006.01)
- *G03F 7/00* (2006.01)
- *H01L 21/768* (2006.01)
- *G03F 7/16* (2006.01)

(52) U.S. Cl.
CPC ...... *H01L 21/0332* (2013.01); *H01L 21/0335* (2013.01); *H01L 21/31144* (2013.01); *H01L 21/76816* (2013.01); *G03F 7/167* (2013.01)

(56) References Cited

U.S. PATENT DOCUMENTS

| | | | | |
|---|---|---|---|---|
| 8,828,885 | B2* | 9/2014 | Lee | H01L 21/02274 438/761 |
| 9,040,433 | B2* | 5/2015 | Lee | H01L 21/02274 438/761 |
| 2007/0202445 | A1* | 8/2007 | Morioka | G03F 7/11 430/313 |
| 2008/0299774 | A1* | 12/2008 | Sandhu | H01L 21/0337 438/696 |
| 2010/0130011 | A1 | 5/2010 | Endoh et al. | |
| 2012/0276709 | A1* | 11/2012 | Taniguchi | H01L 21/76224 438/400 |

\* cited by examiner

METHOD FOR FORMING LINE END SPACE STRUCTURE USING TRIMMED PHOTO RESIST

RELATED APPLICATIONS

This application is a continuation of and claims priority to U.S. patent application Ser. No. 14/479,404, filed on Sep. 8, 2014, and titled "PHOTO RESIST TRIMMED LINE END SPACE," which is a continuation of and claims priority to U.S. Pat. No. 8,828,885, filed on Jan. 10, 2013, and titled "PHOTO RESIST TRIMMED LINE END SPACE." U.S. patent application Ser. No. 14/479,404 and U.S. Pat. No. 8,828,885 are incorporated herein by reference.

BACKGROUND

Generally, semiconductor devices are associated with one or more rows of metal lines. For example, a distance between a first metal line row and a second metal line row is associated with a run-to-run space. For another example, a distance between a one metal line of a row and another metal line in the same row is associated with an end-to-end space.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
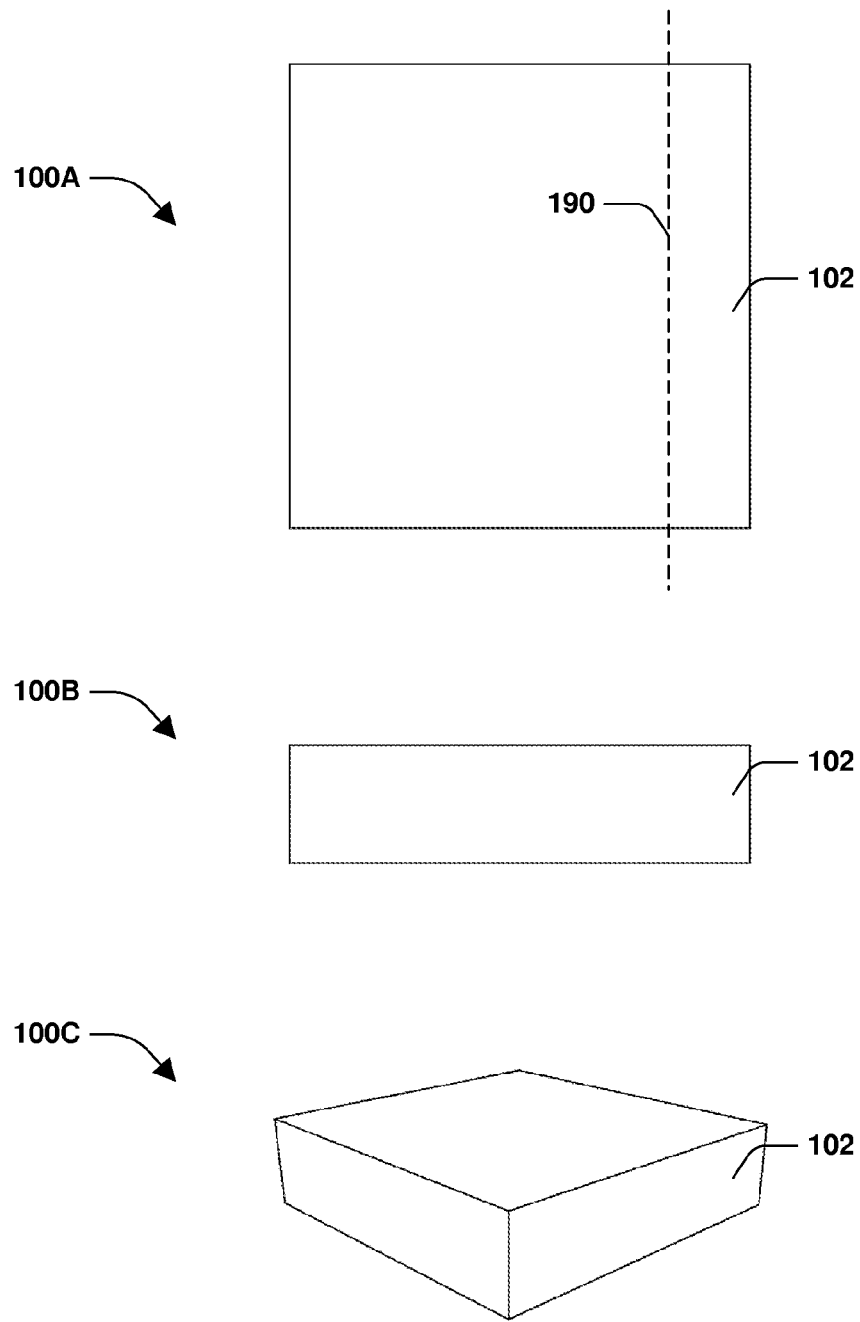
FIG. 1 illustrates various views of an example line end space structure during formation, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

Figure 22:
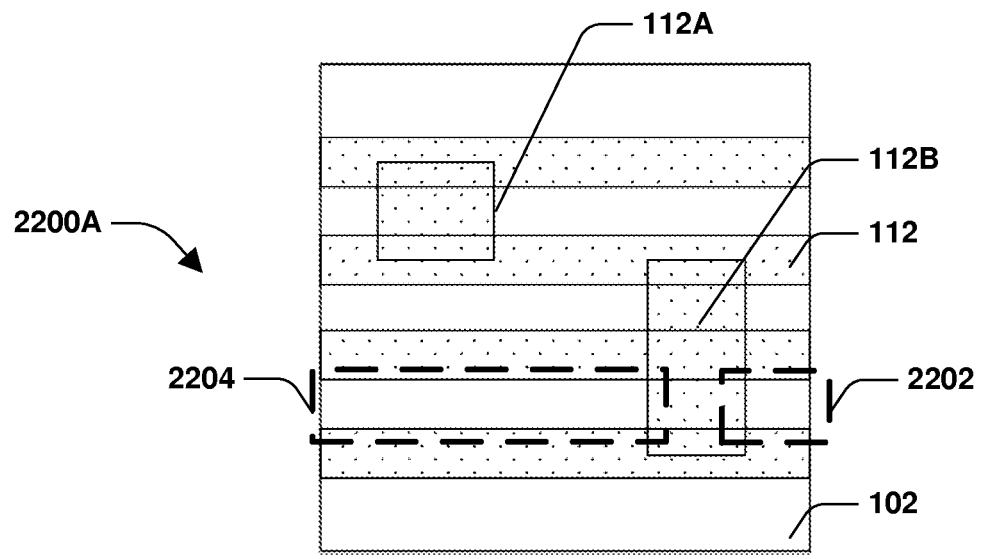
FIG. 22 illustrates various views of an example line end space structure during formation, according to some embodiments.
Figure 22:
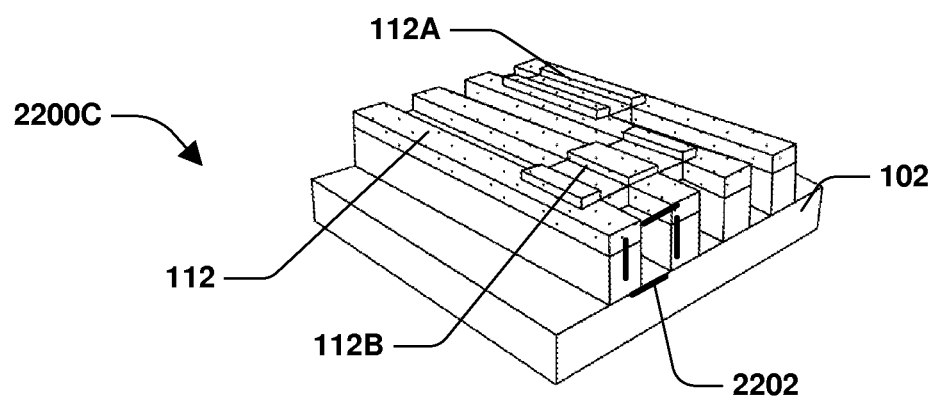

It will be appreciated that for at least some of the figures herein, one or more boundaries, such as boundary 2202 or 2204 of FIG. 22, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable in the figures, and thus are drawn slightly apart from one another, in at least some of the figures, so that they are distinguishable from one another, for example. As another example, because a feature is associated with an irregular shape, a box drawn with a dashed line, dotted lined, etc. does not necessarily encompass the entire feature. Similarly, a drawn box does not necessarily encompass merely the associated feature, but encompasses at least some of one or more other features as well, in some embodiments. Accordingly, dimensions of some of these boundaries are drawn taller, shorter, wider, narrower, etc. than needed in some embodiments so that the different boundaries are visible in the figures, for example.

The following figures illustrate formation of an example line end space structure associated with semiconductor fabrication, according to some embodiments. It will be appreciated that the respective figures are described with reference to one another, such as with reference to a previous figure, for example.

Accordingly, FIG. 1 illustrates various views of an example line end space structure during formation, according to some embodiments. For example, 100A is a top-down view of an example line end space structure during formation, according to some embodiments. In some embodiments, a base region 102 is formed. Additionally, 100B is a cross-sectional view of an example line end space structure during formation, according to some embodiments. For example, the cross-sectional view 100B is associated with cross-section 190 of 100A. It will be appreciated that the cross-sectional views of figures herein are associated with similar cross-sections, for example. In some embodiments, the base region 102 is formed based on at least one of chemical vapor deposition (CVD) or plasma enhanced chemical vapor deposition (PECVD). In some embodiments, the base region 102 comprises a dielectric, such as a low k (LK) dielectric material. Additionally, 100C is a perspective view of an example line end space structure during formation, according to some embodiments.

Figure 2:
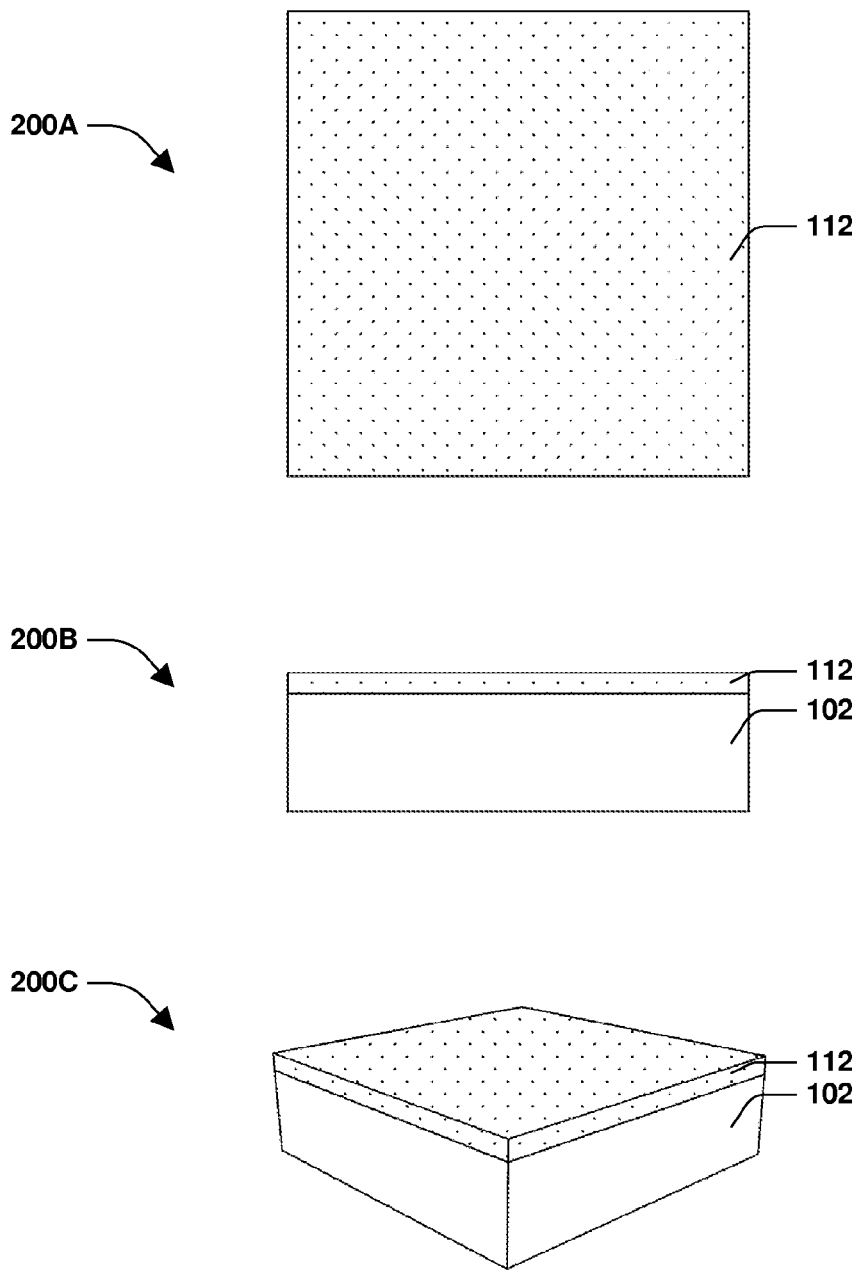
FIG. 2 illustrates various views of an example line end space structure during formation, according to some embodiments.

FIG. 2 illustrates various views of an example line end space structure during formation, according to some embodiments. For example, 200A is a top-down view of an example line end space structure during formation, according to some embodiments. In some embodiments, a first hard mask (HM) region 112 is formed. For example, the first HM region 112 is formed above at least some of the base region 102. Additionally, 200B is a cross-sectional view of an example line end space structure during formation, according to some embodiments. In some embodiments, the first HM region 112 is formed based on at least one of physical vapor deposition (PVD), CVD, or atomic layer deposition (ALD). For example, the first HM region 112 is deposited on the base region 102. It will be appreciated that since 200A is a top-down view, the base region 102 is not visible, at least because the first HM region 112 is above the base region 102. Additionally, 200C is a perspective view of an example line end space structure during formation, according to some embodiments.

Figure 3:
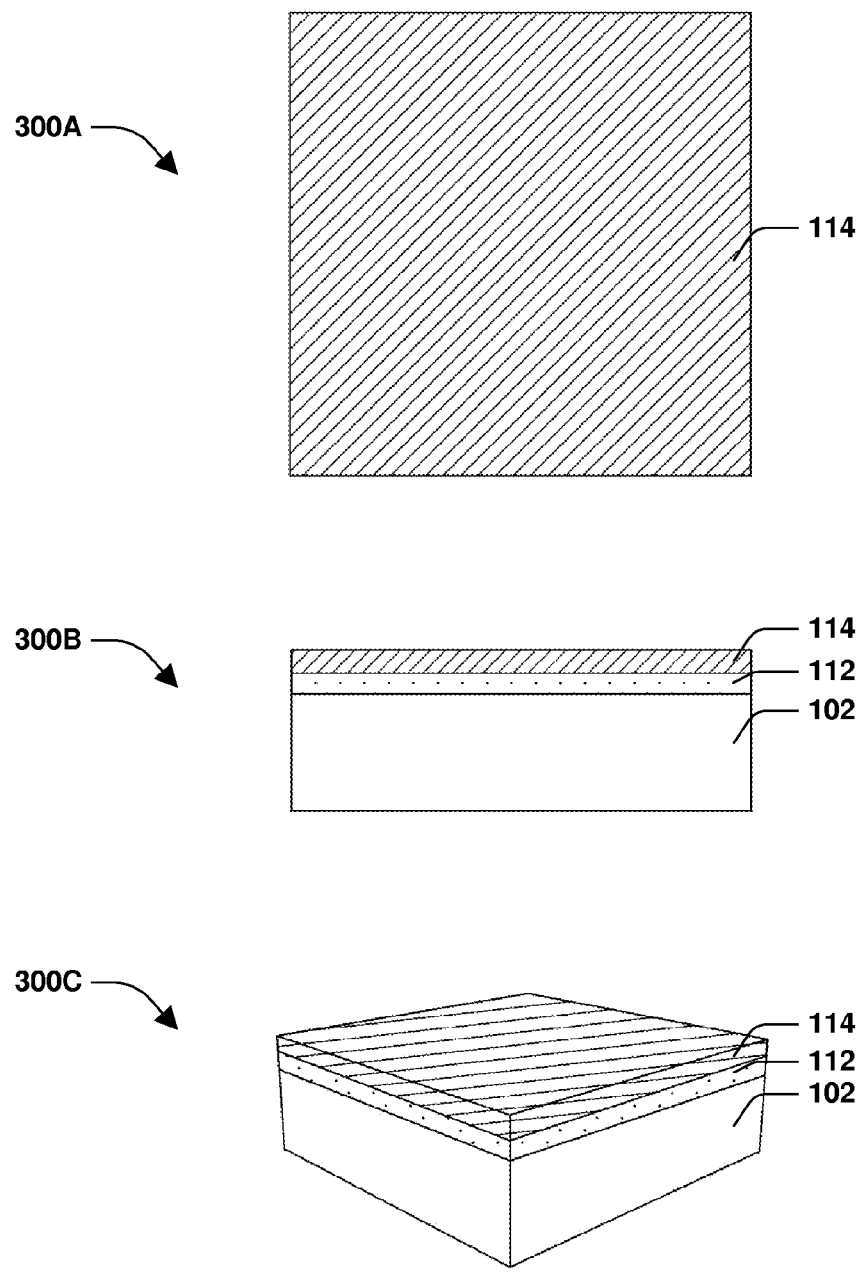
FIG. 3 illustrates various views of an example line end space structure during formation, according to some embodiments.

FIG. 3 illustrates various views of an example line end space structure during formation, according to some embodiments. For example, 300A is a top-down view of an example line end space structure during formation, according to some embodiments. In some embodiments, a second HM region 114 is formed. For example, the second HM region 114 is formed above at least some of the first HM region 112. Additionally, 300B is a cross-sectional view of an example line end space structure during formation, according to some embodiments. In some embodiments, the second HM region 114 is formed based on at least one of ALD, CVD, PVD, or PECVD, for example. In some embodiments, the second HM region 114 is deposited on the first HM region 112. It will be appreciated that since 300A is a top-down view, the base region 102 and the first HM region 112 are not visible, at least because the second HM region 114 is above the first HM region 112 and the base region 102. Similarly, for other top-down figures herein, generally, merely layers or regions on the surface are depicted, although regions below the surface region may be illustrated in phantom (by dashed or dotted lines), for example. Additionally, 300C is a perspective view of an example line end space structure during formation, according to some embodiments.

Figure 4:
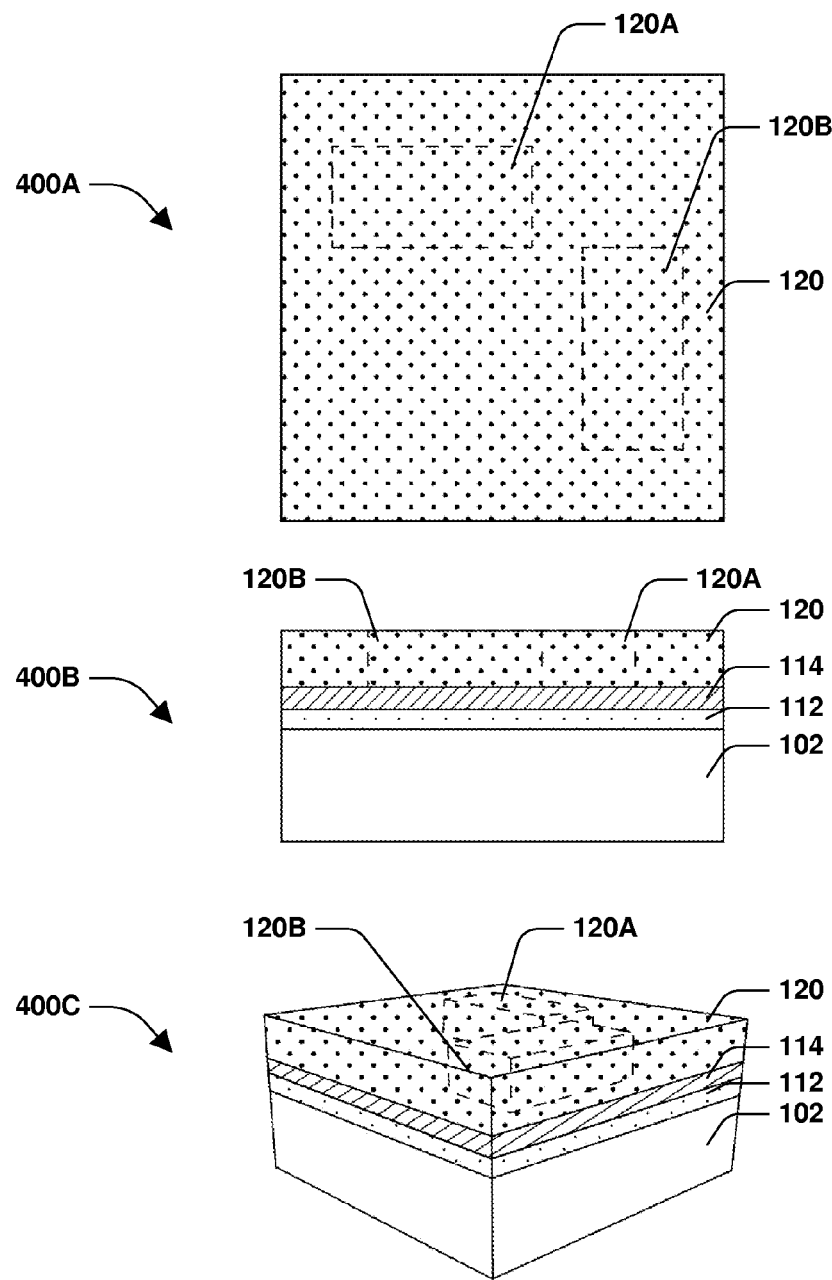
FIG. 4 illustrates various views of an example line end space structure during formation, according to some embodiments.

FIG. 4 illustrates various views of an example line end space structure during formation, according to some embodiments. For example, 400A is a top-down view of an example line end space structure during formation, according to some embodiments. In some embodiments, a first photo resist (PR) region 120 is formed. In some embodiments, the first PR region 120 comprises a first patterned first PR region 120A and a second patterned first PR region 120B. It will be appreciated that the first patterned first PR region 120A and the second patterned first PR region 120B are not distinct from the first PR region 120 in some embodiments. For example, the first PR region 120 is formed above at least some of the second HM region 114. Additionally, 400B is a cross-sectional view of an example line end space structure during formation, according to some embodiments. In some embodiments, the first PR region 120 is formed based on spin coating, such as by spin coating the PR above the second HM region 114, for example. Additionally, 400C is a perspective view of an example line end space structure during formation, according to some embodiments.

Figure 5:
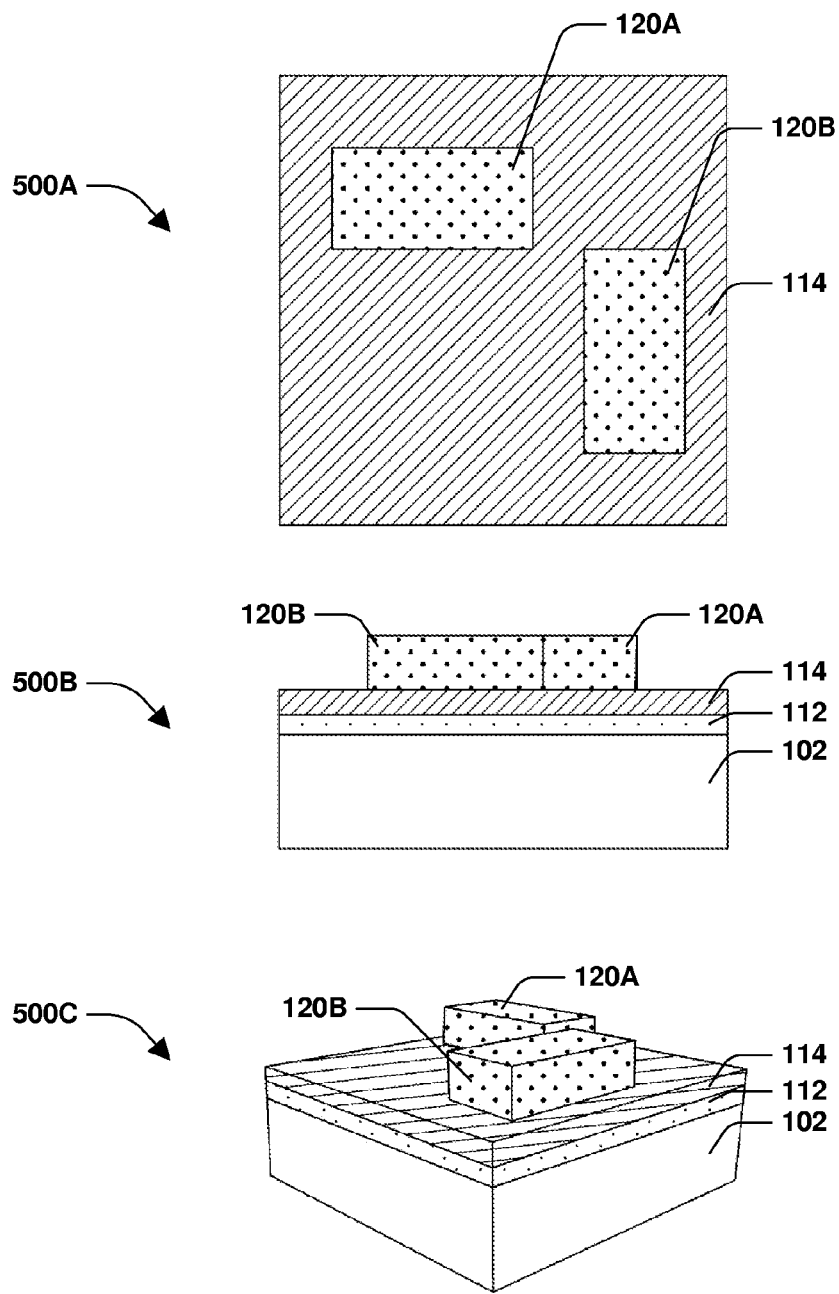
FIG. 5 illustrates various views of an example line end space structure during formation, according to some embodiments.

FIG. 5 illustrates various views of an example line end space structure during formation, according to some embodiments. For example, 500A is a top-down view of an example line end space structure during formation, according to some embodiments. In some embodiments, one or more patterned first PR regions are formed. For example, the first PR region 120 is patterned to form one or more patterned first PR regions. For example, the first PR region 120 is patterned to form a first patterned first PR region 120A and a second patterned first PR region 120B. In some embodiments, respective patterned first PR regions are associated with one or more pattern locations. For example, the first patterned first PR region 120A is associated with a first pattern location. For another example, the second patterned first PR region 120B is associated with a second pattern location. In this way, a first patterned first PR region 120A is formed above at least some of the second HM region 114. Additionally, the first patterned first PR region 120A is associated with the first pattern location. Accordingly, at least some of the second HM region 114 is exposed. Additionally, 500B is a cross-sectional view of an example line end space structure during formation, according to some embodiments. Additionally, 500C is a perspective view of an example line end space structure during formation, according to some embodiments. In some embodiments, a pattern location is associated with one or more line locations. For example, the first pattern location of the first patterned first PR region 120A is associated with a first line location. Similarly, a second patterned first PR region 120B is associated with a second pattern location and at least one of a second line location or a third line location. In some embodiments, at least one of the first patterned first PR region 120A or the second patterned first PR region 120B is formed above at least some of the second HM region 114. In some embodiments, the first patterned first PR region 120A is associated with at least one of a first end-to-end (EE) space pattern or a first line end space structure configured to separate a first metal line from a second metal line. Similarly, the second patterned first PR region 120B is associated with at least one of a second EE space pattern or a second line end space structure configured to separate one or more metal lines into one or more portions. It will be appreciated that respective patterned first PR regions, such as 120A or 120B, or EE space patterns are formed before spacer deposition, for example.

Figure 6:
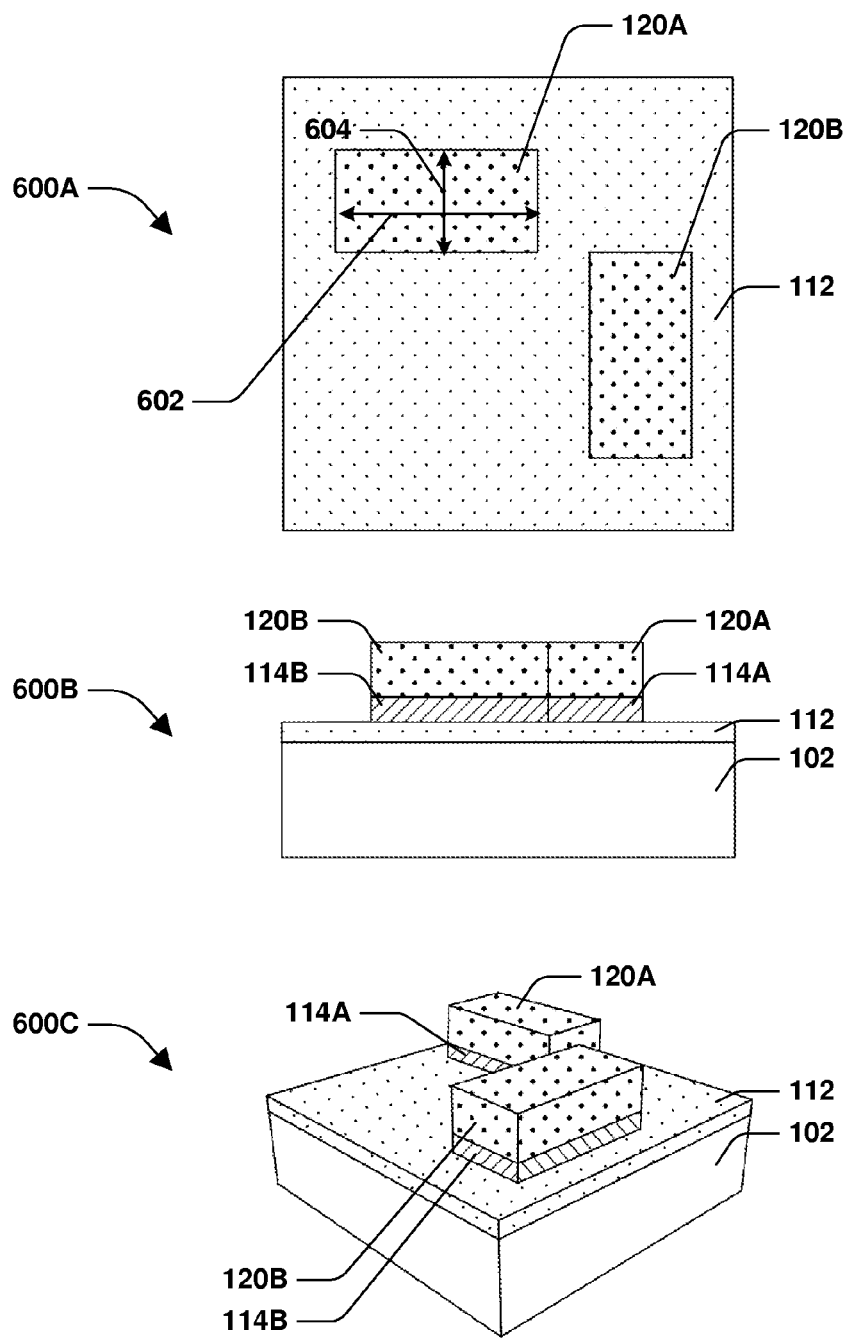
FIG. 6 illustrates various views of an example line end space structure during formation, according to some embodiments.

FIG. 6 illustrates various views of an example line end space structure during formation, according to some embodiments. For example, 600A is a top-down view of an example line end space structure during formation, according to some embodiments. In some embodiments, one or more patterned second HM regions are formed based on respective patterned first PR regions. In some embodiments, respective patterned second HM regions are associated with respective pattern locations. For example, a first patterned second HM region 114A is formed based on the first patterned first PR region 120A. Additionally, the first patterned second HM region 114A is associated with the first pattern location of the first patterned first PR region 120A. Similarly, a second patterned second HM region 114B is formed based on the second patterned first PR region 120B. Additionally, the second patterned second HM region 114B is associated with the second pattern location of the second patterned first PR region 120B. In some embodiments, the second HM region, such as the second HM region 114 of FIG. 5 comprises the first patterned second HM region 114A and the second patterned second HM region 114B. In some embodiments, a patterned first PR region, such as the first patterned first PR region 120A comprises a width 604 associated with a distance greater than a width of a metal line, such as a width indicated by 1902 of FIG. 19, for example, and a length 602 associated with an end-to-end (EE) space associated with a corresponding line end space structure. It will be appreciated that in some embodiments, width 604 is associated with a distance such that the first patterned first PR region 120A does not overlap neighboring metal lines, such as a corresponding area between 150B and 150C of FIG. 19, for example. In some embodiments, a patterned PR region, such as the first patterned first PR region 120A is associated with an overlay window. Additionally, 600B is a cross-sectional view of an example line end space structure during formation, according to some embodiments. Accordingly, at least some of the first HM region 112 is exposed. Additionally, 600C is a perspective view of an example line end space structure during formation, according to some embodiments. In some embodiments, the first patterned second HM region 114A is associated with at least one of a first end-to-end (EE) space pattern or a first line end space structure configured to separate a first metal line from a second metal line. Similarly, the second patterned second HM region 114B is associated with at least one of a second EE space pattern or a second line end space structure configured to separate one or more metal lines into one or more portions. It will be appreciated that respective patterned second HM regions, such as 114A or 114B, or EE space patterns are formed before spacer deposition, for example.

Figure 7:
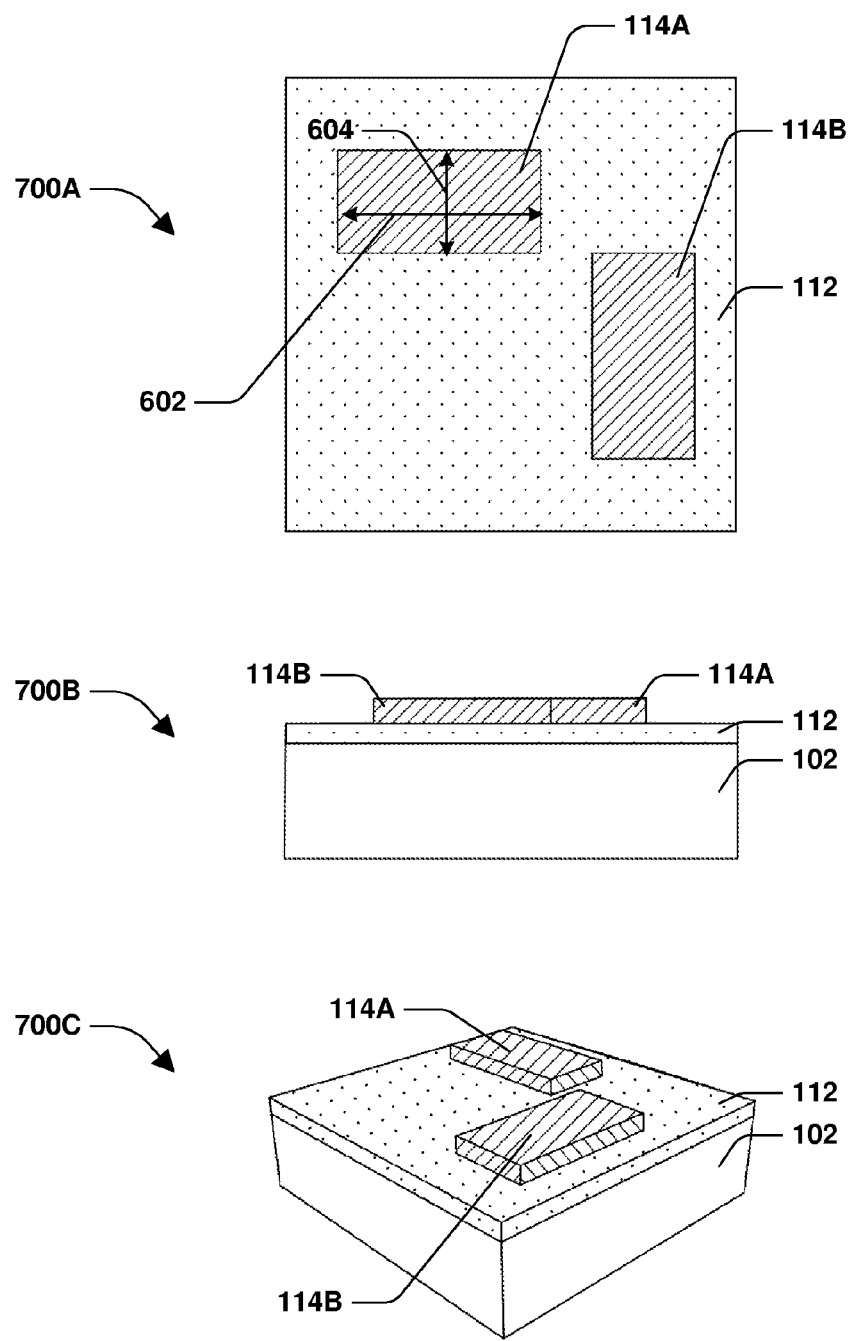
FIG. 7 illustrates various views of an example line end space structure during formation, according to some embodiments.

FIG. 7 illustrates various views of an example line end space structure during formation, according to some embodiments. For example, 700A is a top-down view of an example line end space structure during formation, according to some embodiments. In some embodiments, one or more patterned first PR regions associated with the first PR region 120 are removed. In some embodiments, the first PR region 120 is removed. For example, the first PR region 120 comprises the first patterned first PR region 120A and the second patterned first PR region 120B. Accordingly, the first patterned first PR region 120A and the second patterned first PR region 120B are removed, for example. In some embodiments, one or more patterned second HM regions are exposed. For example, at least one of the first patterned second HM region 114A or the second patterned second HM region 114B is exposed. Since at least one of the first patterned second HM region 114A or the second patterned second HM region 114B is formed from the second HM region 114, it will be appreciated that respective patterned second HM regions 114A or 114B are above the second HM region 112, according to some embodiments. In some embodiments, a patterned second HM region, such as the first patterned second HM region 114A, comprises a width 604 associated with a distance greater than a width of a metal line, such as a width indicated by 1902 of FIG. 19, for example, and a length 602 associated with an end-to-end (EE) space associated with a corresponding line end space structure. It will be appreciated that in some embodiments, width 604 is associated with a distance such that the first patterned first PR region 120A does not overlap neighboring metal lines, such as a corresponding area between 150B and 150C of FIG. 19, for example. In some embodiments, a patterned PR region, such as the first patterned first PR region 120A is associated with an overlay window. In some embodiments, the width 604 and length 602 are the same as the width 604 and length 602 of the first patterned first PR region 120A of FIG. 6, respectively. Additionally, 700B is a cross-sectional view of an example line end space structure during formation, according to some embodiments. In some embodiments, at least one of the first patterned first PR region 120A, the second patterned first PR region 120B, the first patterned second HM region 114A, or the second patterned second HM region 114B is an end-to-end (EE) space pattern for an EE space pattern, such as a line end space structure. Additionally, 700C is a perspective view of an example line end space structure during formation, according to some embodiments. It will be appreciated that at least one of the first patterned second HM region 114A or the second patterned second HM region 114B is formed before spacer deposition, at least because the line end space structure is formed based on self aligned multiple patterning. For example, the first patterned second HM region 114A is aligned with one or more line locations for one or more metal lines and configured to separate at least one of the metal lines into one or more portions.

Figure 8:
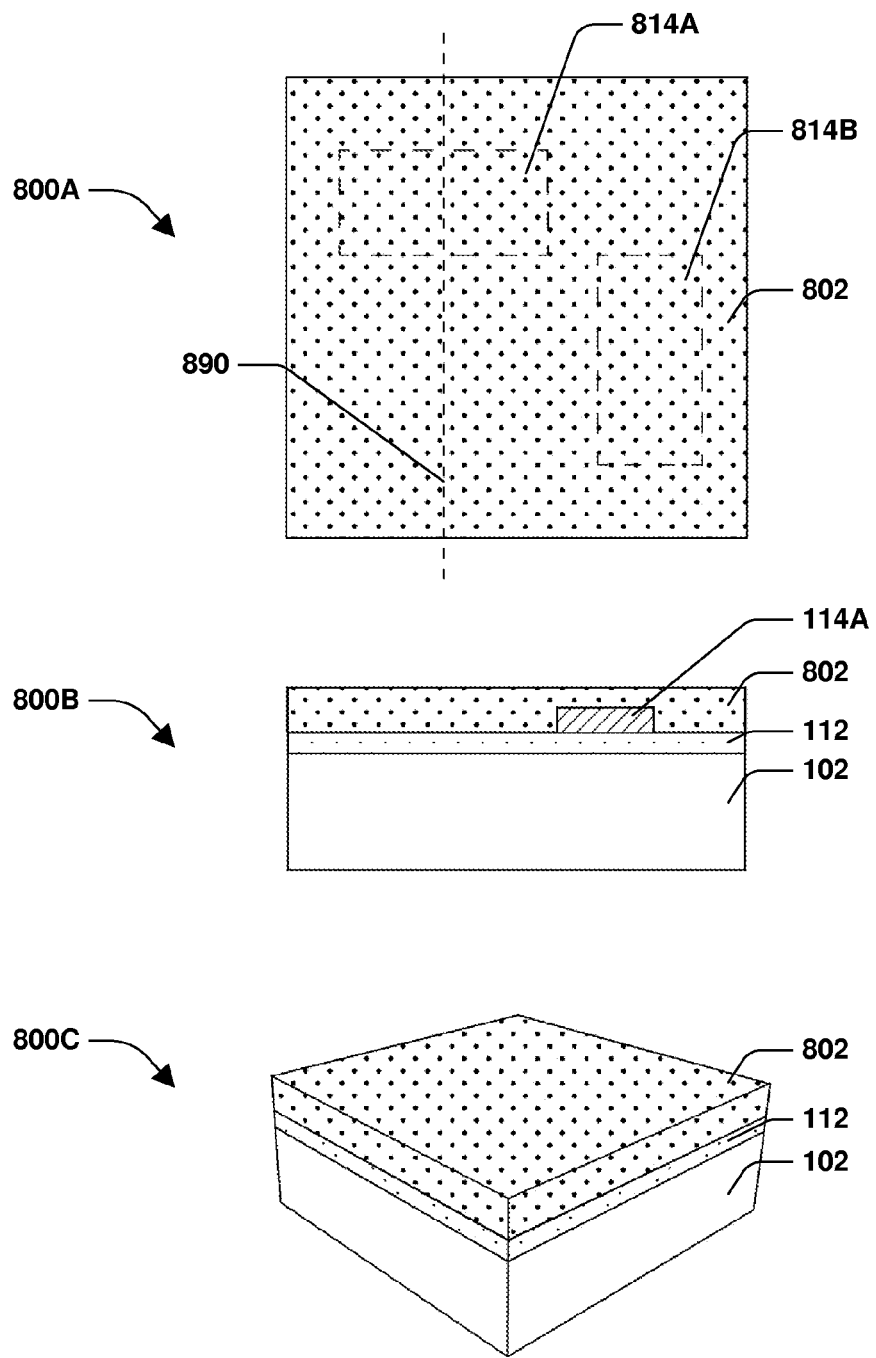
FIG. 8 illustrates various views of an example line end space structure during formation, according to some embodiments.

FIG. 8 illustrates various views of an example line end space structure during formation, according to some embodiments. For example, 800A is a top-down view of an example line end space structure during formation, according to some embodiments. For example, a trim PR region 802 is formed above at least some of at least one of the first HM region 112 or the one or more patterned second HM regions. In some embodiments, the trim PR region 802 is formed above or surrounding at least some of at least one of the first patterned second HM region 114A, the second patterned second HM region 114B, or the first HM region 112. Accordingly, 814A and 814B are indicative of the first patterned second HM region 114A and the second patterned second HM region 114B. In some embodiments, 814A and 814B are a first pattern location and a second pattern location, for example. However, it will be appreciated that respective pattern locations are modified in some embodiments. Additionally, 800B is a cross-sectional view of an example line end space structure during formation, according to some embodiments. It will be appreciated that the second patterned second HM region 114B is not visible in

800B, at least because cross-section 890 of 800A does not intersect 814B, for example. In some embodiments, the trim PR region 802 is formed based on spin coating, such as spin coating the PR above at least one of the first HM region 112 or one or more patterned second HM regions, for example. Additionally, 800C is a perspective view of an example line end space structure during formation, according to some embodiments. It will be appreciated that at least one of the first patterned second HM region 114A or the second patterned second HM region 114B is not visible in 800C, at least because respective second HM regions 114A and 114B are encased within the trim PR region 802, according to some embodiments.

Figure 9:
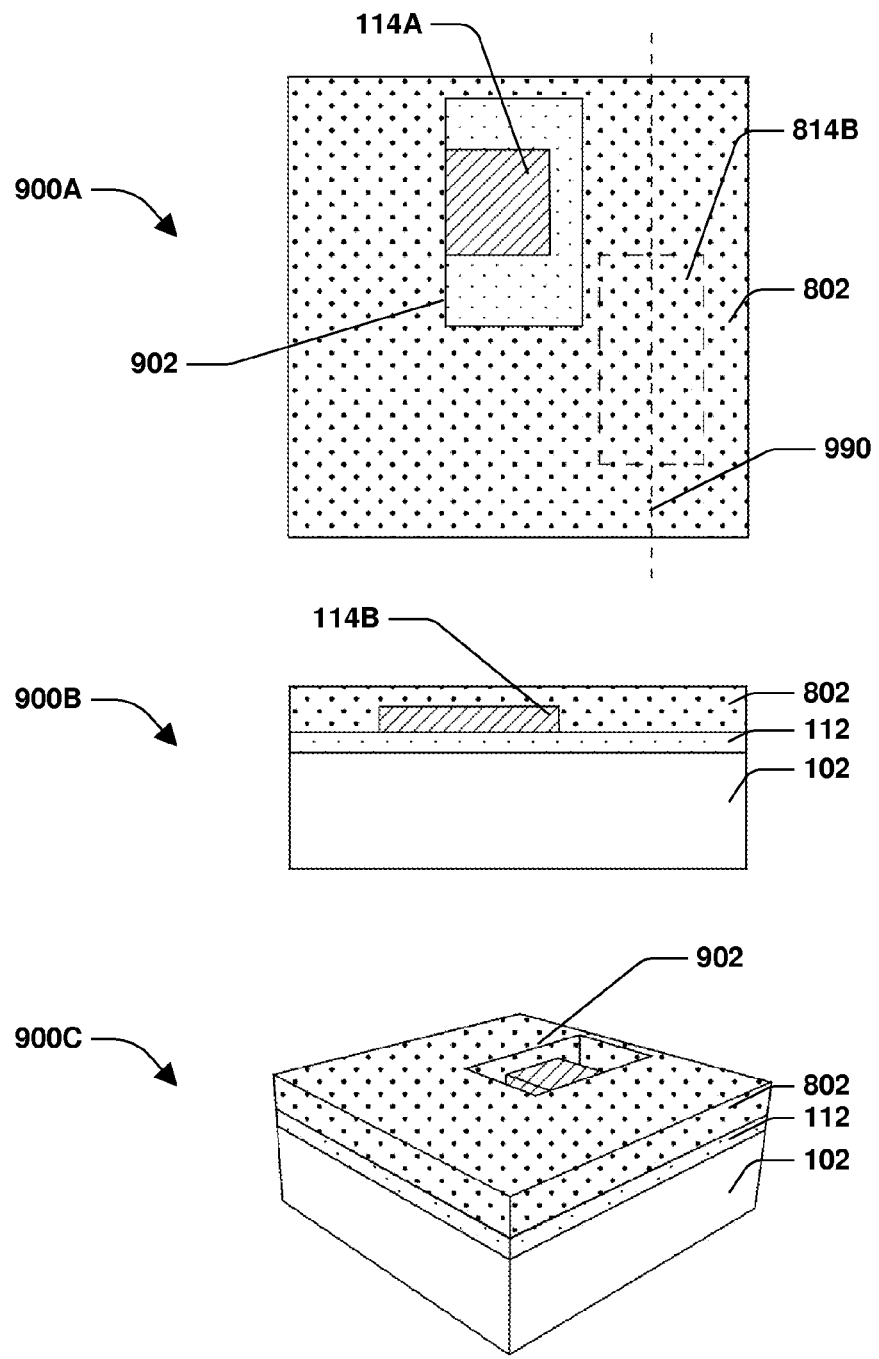
FIG. 9 illustrates various views of an example line end space structure during formation, according to some embodiments.

FIG. 9 illustrates various views of an example line end space structure during formation, according to some embodiments. For example, 900A is a top-down view of an example line end space structure during formation, according to some embodiments. In some embodiments, one or more windows are formed within the trim PR region 802. For example, respective windows facilitate trimming of one or more patterned second HM regions. For example, a window 902 is formed within the trim PR region 802. In some embodiments, the window 902 is formed to be associated with least some of one or more pattern locations. For example, the window 902 is formed to be associated with at least some of the first pattern location of the first patterned second HM region 114A. In some embodiments, the window 902 is formed based on a mask. In some embodiments, the window 902 is formed to 'cover' or expose at least some of one or more pattern locations. For example, window 902 is formed to 'cover' or expose at least some of the first pattern location associated with the first patterned second HM region 114A. In this way, a portion of the first patterned second HM region 114A is not encased or surrounded by the trim PR 802. Accordingly, at least some of at least one of the first HM region 112 or the first patterned second HM region 114A is exposed based on the window 902, for example. Additionally, 900B is a cross-sectional view of an example line end space structure during formation, according to some embodiments. It will be appreciated that the first patterned second HM region 114A is not visible in 900B, at least because cross-section 990 of 900A does not intersect 114A, for example. Additionally, 900C is a perspective view of an example line end space structure during formation, according to some embodiments. It will be appreciated that at least one of a portion of the first patterned second HM region 114A or the second patterned second HM region 114B is not visible in 900C, at least because respective second HM regions 114A and 114B are at least partially encased within the trim PR region 802. However, a portion of the first patterned second HM region 114A associated with window 902 is exposed, according to some embodiments.

Figure 10:
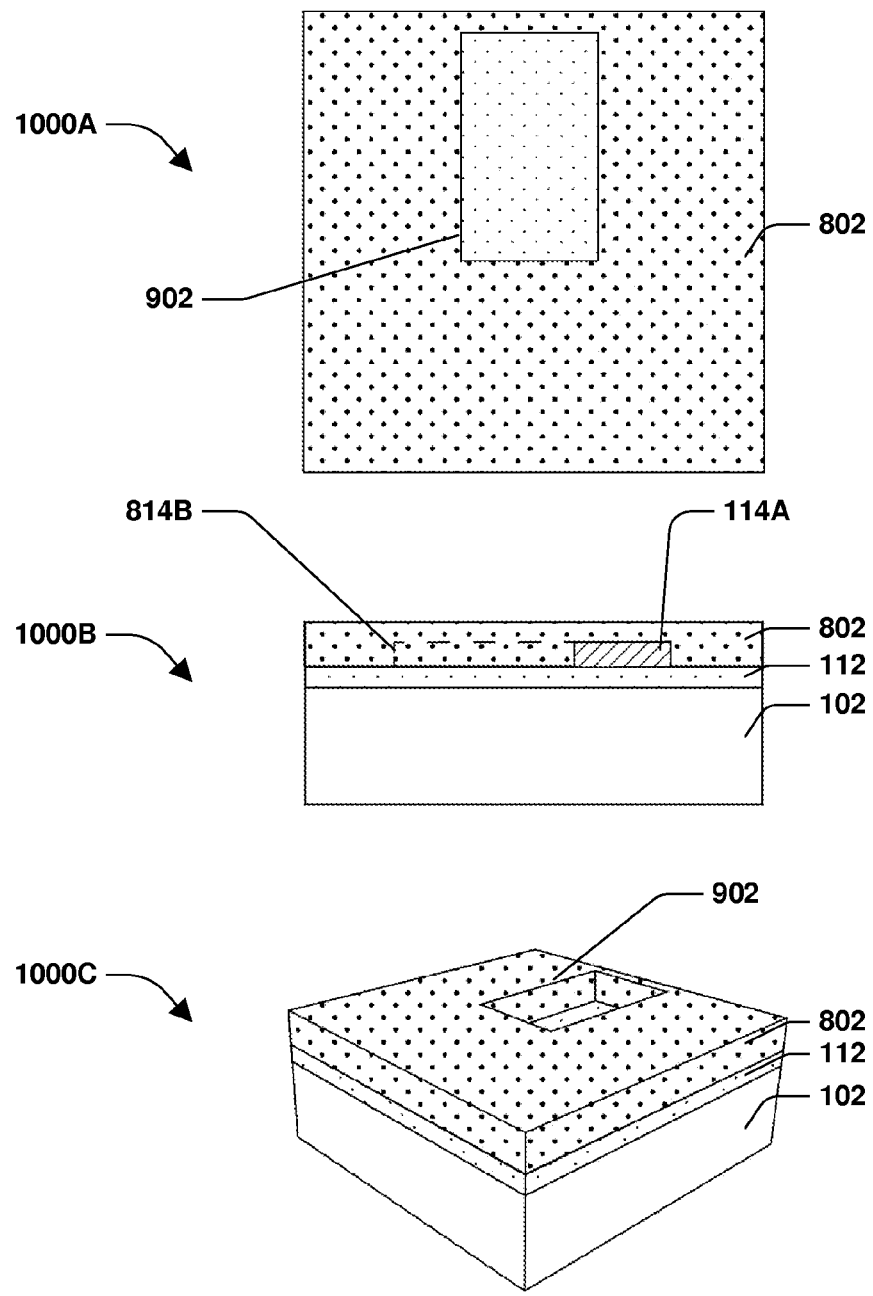
FIG. 10 illustrates various views of an example line end space structure during formation, according to some embodiments.

FIG. 10 illustrates various views of an example line end space structure during formation, according to some embodiments. For example, 1000A is a top-down view of an example line end space structure during formation, according to some embodiments. In some embodiments, at least some of at least one of the patterned second HM regions is removed. For example, at least some of the first patterned second HM region 114A is removed. For example, a portion of the first patterned second HM region 114A associated with window 902 is removed. In this way, the first patterned second HM region 114A is trimmed, and a length associated with the first patterned second HM region 114A is reduced. In some embodiments, at least some of the first patterned second HM region 114A is removed based on the window 902 within the trim PR region 802. Additionally, 1000B is a cross-sectional view of an example line end space structure during formation, according to some embodiments. Additionally, 1000C is a perspective view of an example line end space structure during formation, according to some embodiments.

Figure 11:
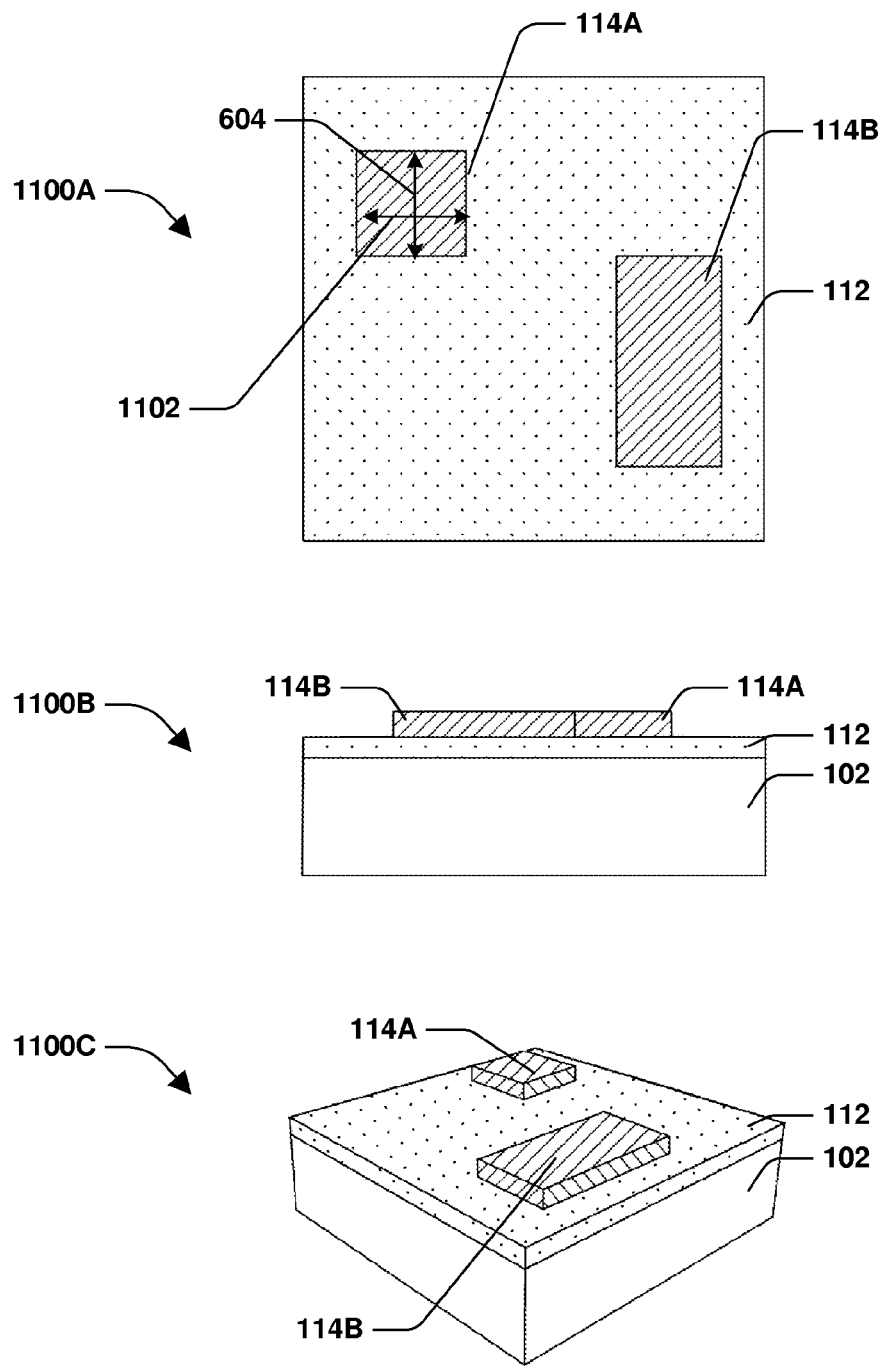
FIG. 11 illustrates various views of an example line end space structure during formation, according to some embodiments.

FIG. 11 illustrates various views of an example line end space structure during formation, according to some embodiments. For example, 1100A is a top-down view of an example line end space structure during formation, according to some embodiments. In some embodiments, the trim PR region 802 of FIG. 10 is removed. Accordingly, at least some of at least one of the first HM region 112 or one or more patterned second HM regions is exposed. For example, the first patterned second HM region 114A and the second patterned second HM region 114B are exposed. In some embodiments, the first patterned second HM region 114A is associated with a length 1102 and a width 604. In some embodiments, the width 604 is associated with a distance greater than a width of a metal line, such as a width indicated by 1902 of FIG. 19, for example, and the length 1102 is associated with an end-to-end (EE) space associated with a corresponding line end space structure. It will be appreciated that in some embodiments, width 604 is associated with a distance such that the first patterned first PR region 120A does not overlap neighboring metal lines, such as a corresponding area between 150B and 150C of FIG. 19, for example. In some embodiments, a patterned PR region, such as the first patterned first PR region 120A is associated with an overlay window. Accordingly, it will be appreciated that length 1102 is less than length 602. Therefore, a line end space structure associated with the first patterned second HM region 114A of FIG. 11 enables a reduced EE space. For example, a line end space structure associated with the first patterned second HM region 114A of FIG. 11 is configured to divide a metal line into a first portion and a second portion such that the first portion is separated from the second portion by the EE space. In some embodiments, the length 1102 is associated with an end-to-end (EE) space less than sixty nanometers, for example. Additionally, 1100B is a cross-sectional view of an example line end space structure during formation, according to some embodiments. Additionally, 1100C is a perspective view of an example line end space structure during formation, according to some embodiments. It will be appreciated that the first patterned second HM region 114A is trimmed before spacer deposition, for example.

Figure 12:
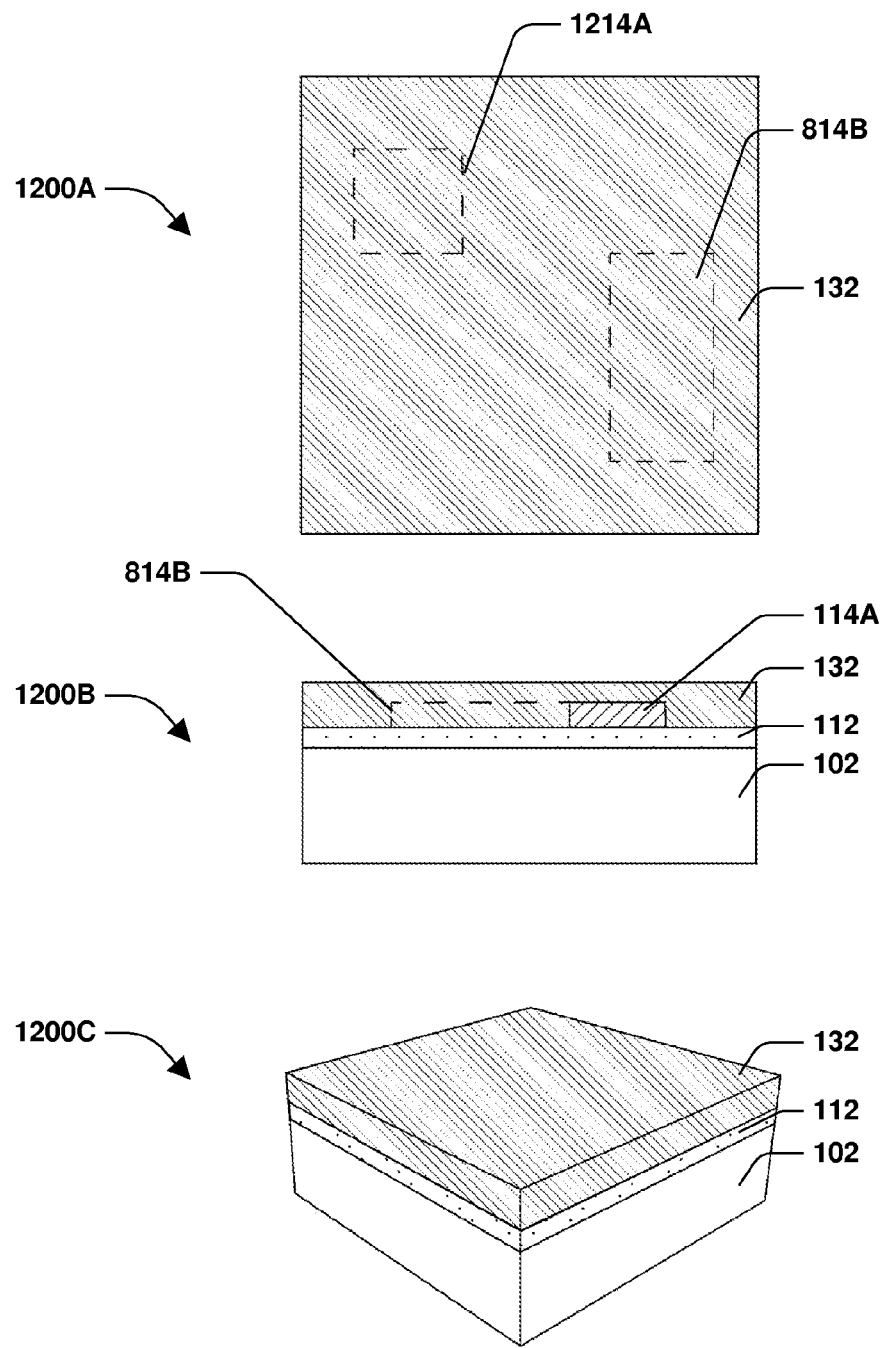
FIG. 12 illustrates various views of an example line end space structure during formation, according to some embodiments.

FIG. 12 illustrates various views of an example line end space structure during formation, according to some embodiments. For example, 1200A is a top-down view of an example line end space structure during formation, according to some embodiments. In some embodiments, a first sacrificial HM region 132 is formed. For example, the first sacrificial HM region 132 is formed above or surrounding at least some of at least one of the first HM region 112 or at least one of the patterned second HM regions. In some embodiments, the first sacrificial HM region 132 is formed above at least some of at least one of the first patterned second HM region 114A, the second patterned second HM region 114B, or the first HM region 112. In some embodiments, the first patterned second HM region 114A is associated with a first pattern location 1214A. It will be appreciated that the first pattern location 1214A is smaller than the first pattern location 814A of FIG. 8, at least because the first patterned second HM region 114A was trimmed to comprise a reduced length 1102, for example. Similarly, the second patterned second HM region 114B is associated with a second pattern location 814B. Additionally, 1200B is a cross-sectional view of an example line end space structure during formation, according to some embodiments. In some embodiments, the first sacrificial HM region 132 is formed based on at least one of spin coating, CVD, or PECVD. Additionally, 1200C is a perspective view of an example line end space structure during formation, according to some embodiments. It will be appreciated that at least one of the first patterned second HM region 114A or the second patterned second HM region 114B is not visible in 1200C, at least because respective second HM regions 114A and 114B are encased within the first sacrificial HM region 132.

It will be appreciated that FIGS. 12-18 are associated with cross-sections similar to cross-section 890 of FIG. 8. Accordingly, the first patterned second HM region 114A is outlined with a solid line, while the second patterned second HM region 114B is not visible, but is indicated by dashed outline of the second pattern location 814B.

Figure 13:
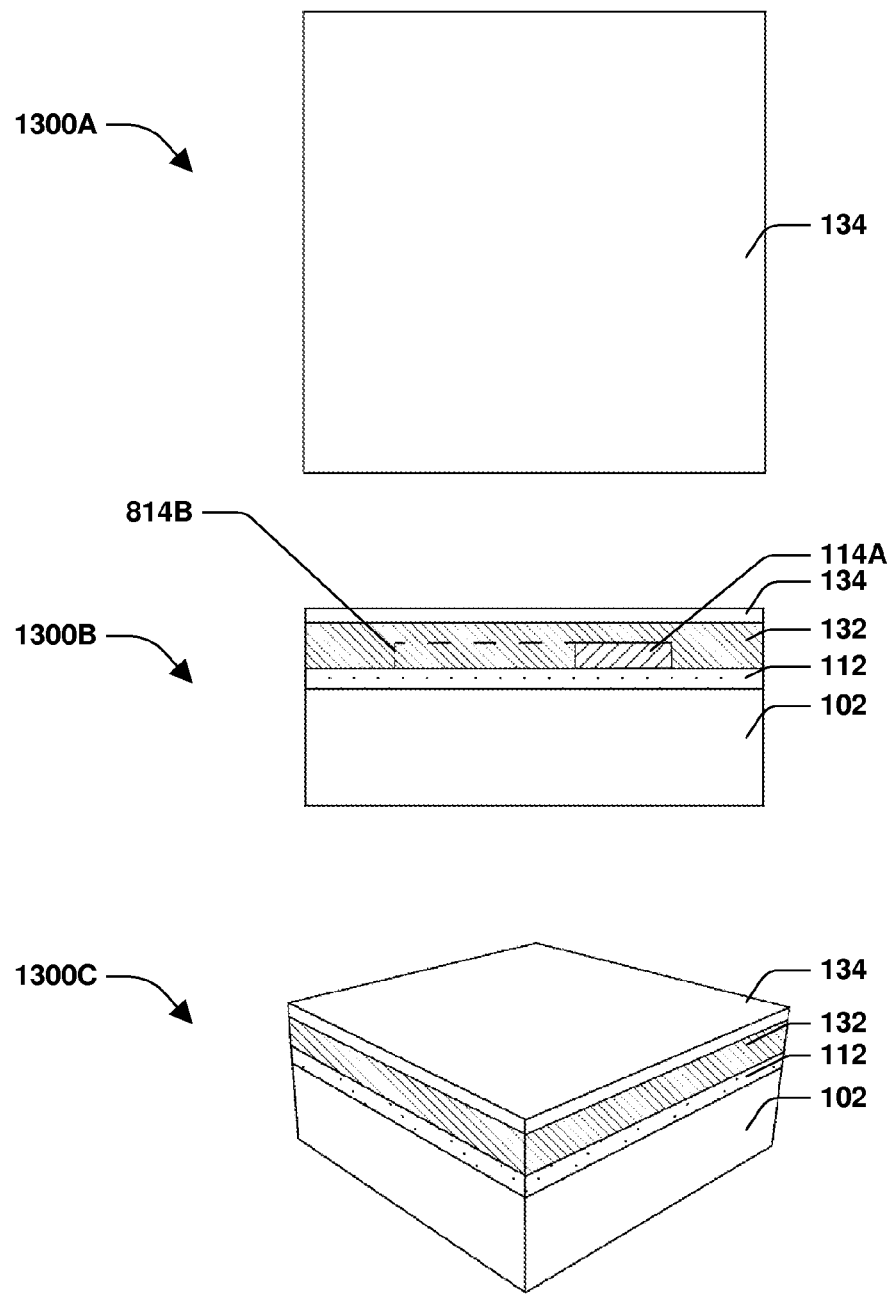
FIG. 13 illustrates various views of an example line end space structure during formation, according to some embodiments.

FIG. 13 illustrates various views of an example line end space structure during formation, according to some embodiments. For example, 1300A is a top-down view of an example line end space structure during formation, according to some embodiments. In some embodiments, a second sacrificial HM region 134 is formed above at least some of the first sacrificial HM region 132. Additionally, 1300B is a cross-sectional view of an example line end space structure during formation, according to some embodiments. In some embodiments, the second sacrificial HM region 134 is formed based on at least one of spin coating, CVD, or PECVD. Additionally, 1300C is a perspective view of an example line end space structure during formation, according to some embodiments.

Figure 14:
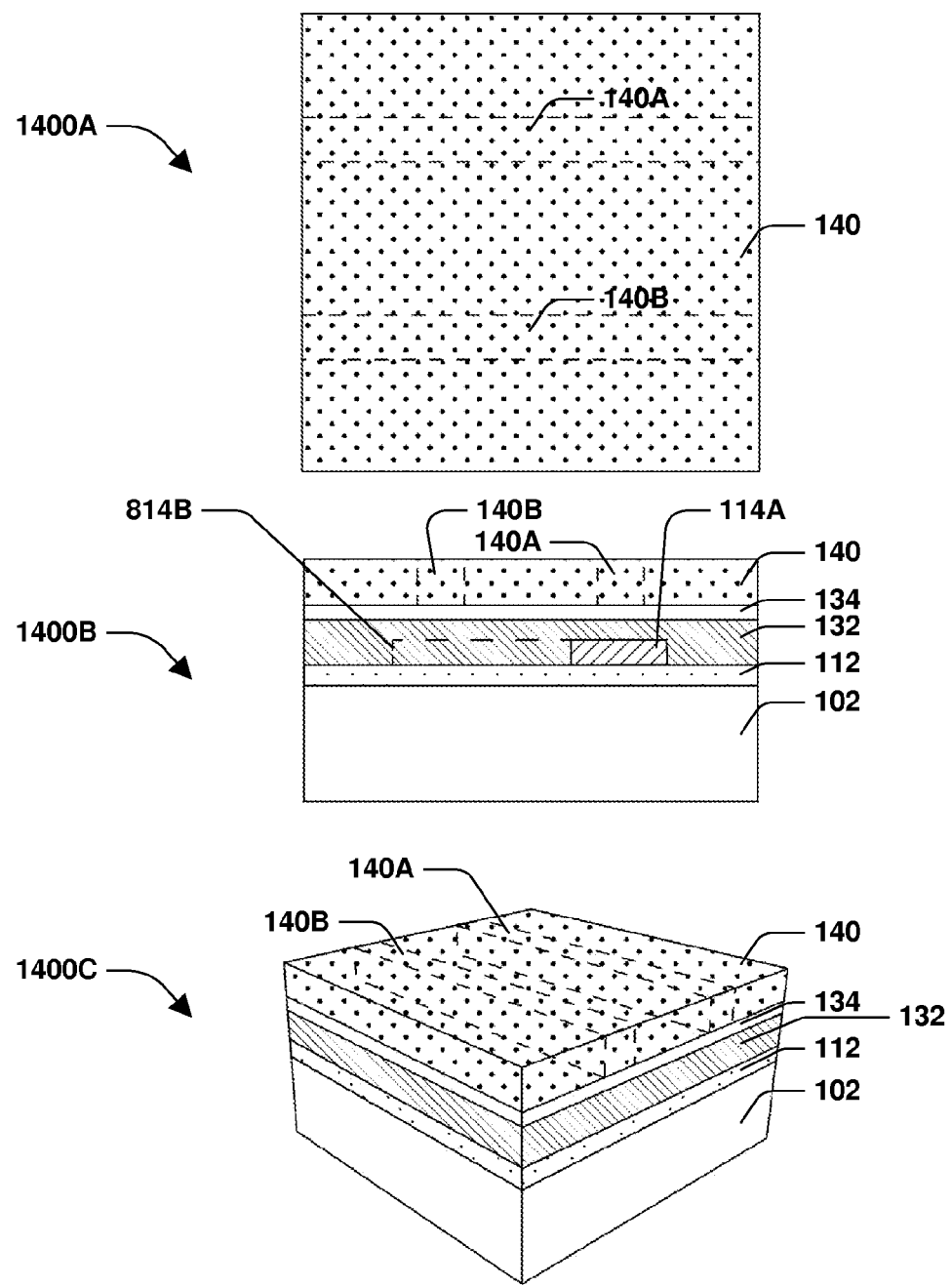
FIG. 14 illustrates various views of an example line end space structure during formation, according to some embodiments.

FIG. 14 illustrates various views of an example line end space structure during formation, according to some embodiments. For example, 1400A is a top-down view of an example line end space structure during formation, according to some embodiments. In some embodiments, a second PR region 140 is formed. For example, the second PR region 140 is formed above at least some of the second sacrificial HM region 134. In some embodiments, the second PR region 140 comprises a first patterned second PR region 140A and a second patterned second PR region 140B. Additionally, 1400B is a cross-sectional view of an example line end space structure during formation, according to some embodiments. In some embodiments, the second PR region 140 is formed based on spin coating, such as spin coating above at least some of the second sacrificial HM region 134. Additionally, 1400C is a perspective view of an example line end space structure during formation, according to some embodiments.

Figure 15:
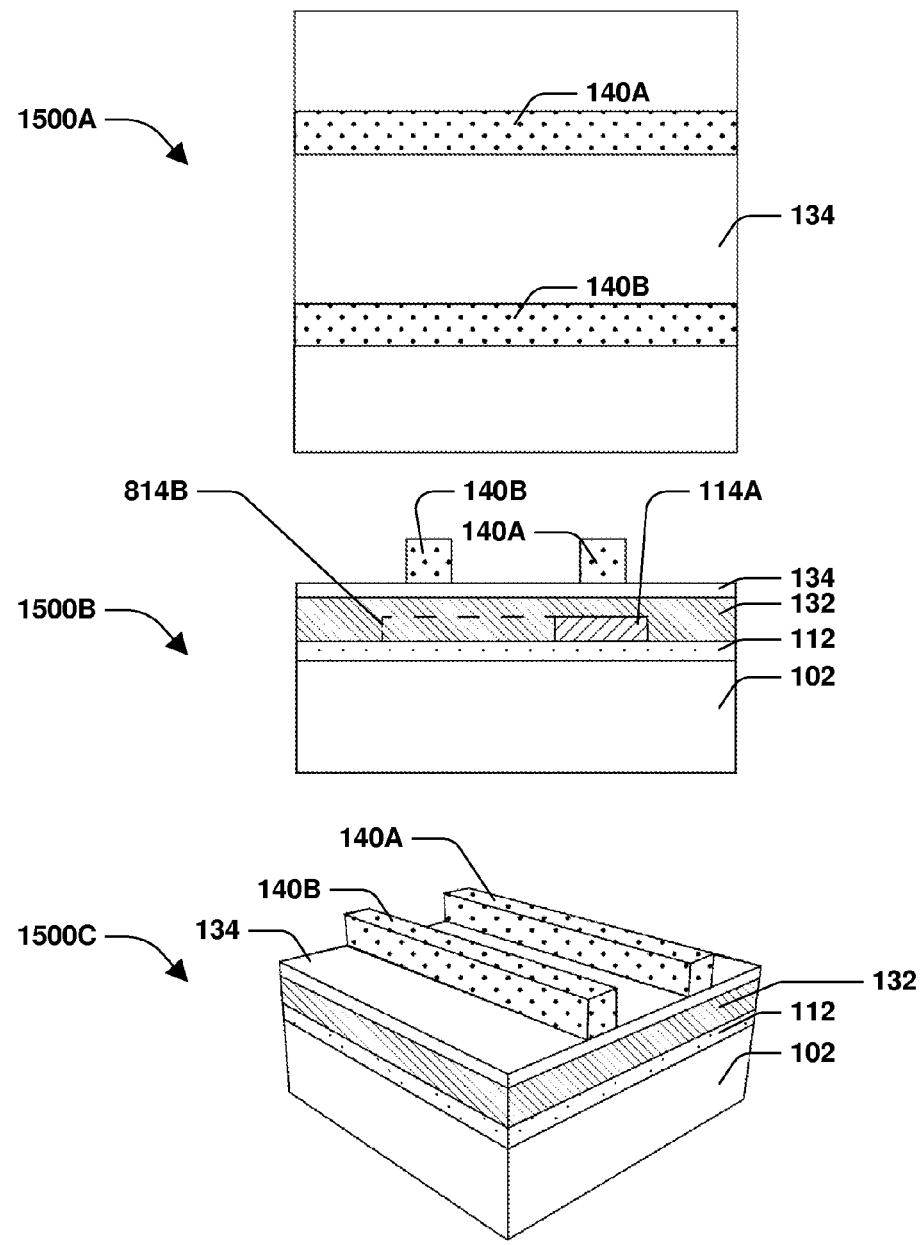
FIG. 15 illustrates various views of an example line end space structure during formation, according to some embodiments.

FIG. 15 illustrates various views of an example line end space structure during formation, according to some embodiments. For example, 1500A is a top-down view of an example line end space structure during formation, according to some embodiments. In some embodiments, the second PR region 140 is patterned to form one or more patterned second PR regions. For example, respective patterned second PR regions are associated with one or more line locations. In some embodiments, the second PR region 140 is patterned to form at least one of a first patterned second PR region 140A or a second patterned second PR region 140B. In some embodiments, the first patterned second PR region 140A is associated with a first line location and the second patterned second PR region 140B is associated with a second line location. For example, the first patterned second PR region 140A is above the first line location and the second patterned second PR region 140B is above the second line location. In this way, a first patterned second PR region 140A and a second patterned second PR region 140B are formed above at least some of the second sacrificial HM region 134 and associated with one or more line locations. Accordingly, at least some of the second sacrificial HM region 134 is exposed during patterning of the second PR region 140. Additionally, 1500B is a cross-sectional view of an example line end space structure during formation, according to some embodiments. For example, the first patterned second PR region 140A is formed above the first line location and above at least some of the second sacrificial HM region 134 For example, the second patterned second PR region 140B is formed above the second line location and above at least some of the second sacrificial HM region 134. Additionally, 1500C is a perspective view of an example line end space structure during formation, according to some embodiments.

Figure 16:
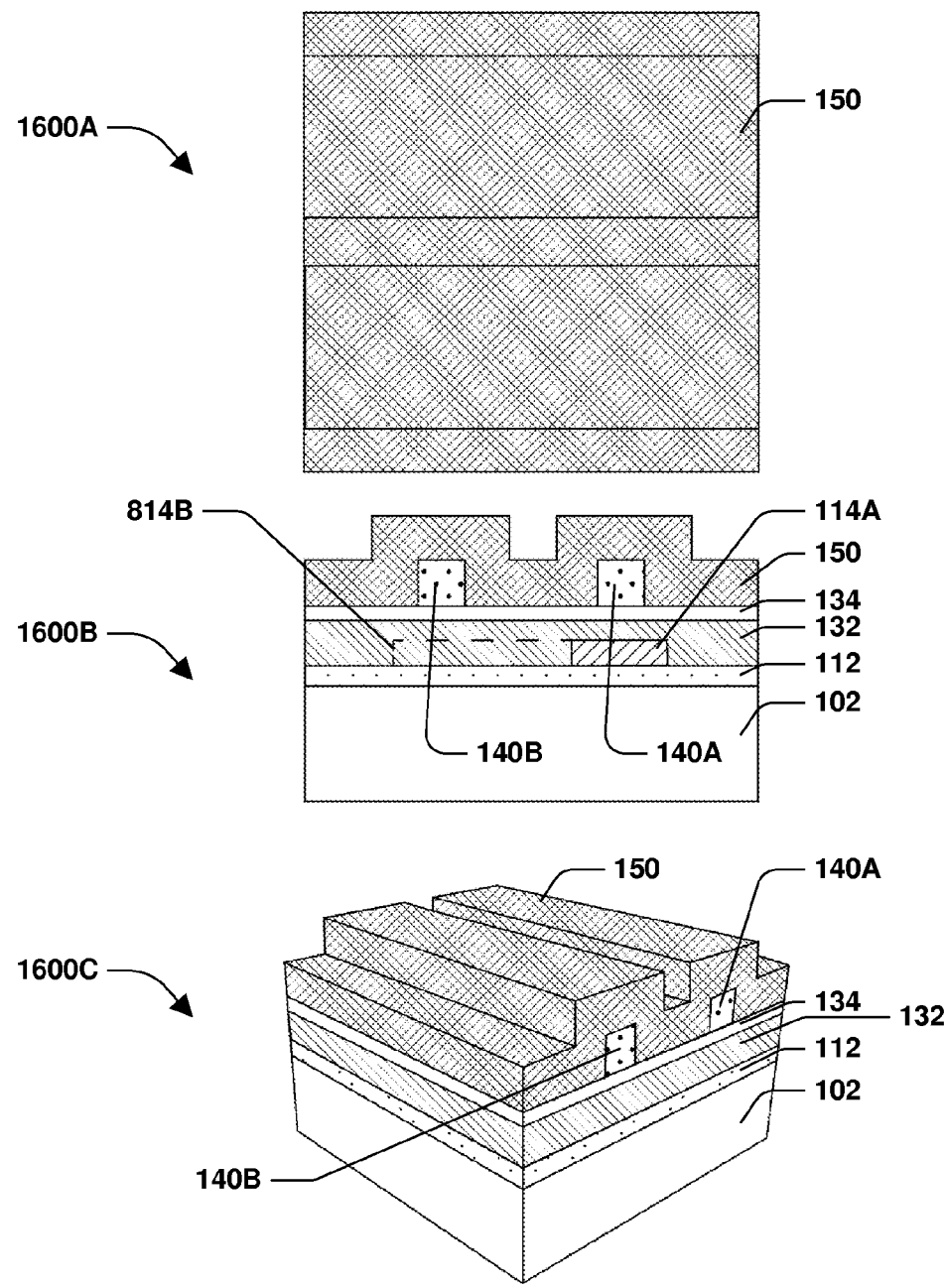
FIG. 16 illustrates various views of an example line end space structure during formation, according to some embodiments.

FIG. 16 illustrates various views of an example line end space structure during formation, according to some embodiments. For example, 1600A is a top-down view of an example line end space structure during formation, according to some embodiments. In some embodiments, a spacer region 150 is formed. For example, the spacer region 150 is formed above at least some of at least one of the second sacrificial HM region 134 or at least one of the patterned second PR regions. For example, the spacer region 150 is formed above at least some of at least one of the first patterned second PR region 140A, the second patterned second PR region 140B, or the second sacrificial HM region 134. In some embodiments, the spacer region 150 is deposited as a 'layer', but does not necessarily comprise a uniform thickness. Additionally, 1600B is a cross-sectional view of an example line end space structure during formation, according to some embodiments. It will be appreciated that the spacer region 150 is formed to surround at least some of at least one of the first patterned second PR region 140A or the second patterned second PR region 140B. In some embodiments, the spacer region 150 is formed based on at least one of ALD or CVD. Additionally, 1600C is a perspective view of an example line end space structure during formation, according to some embodiments.

Figure 17:
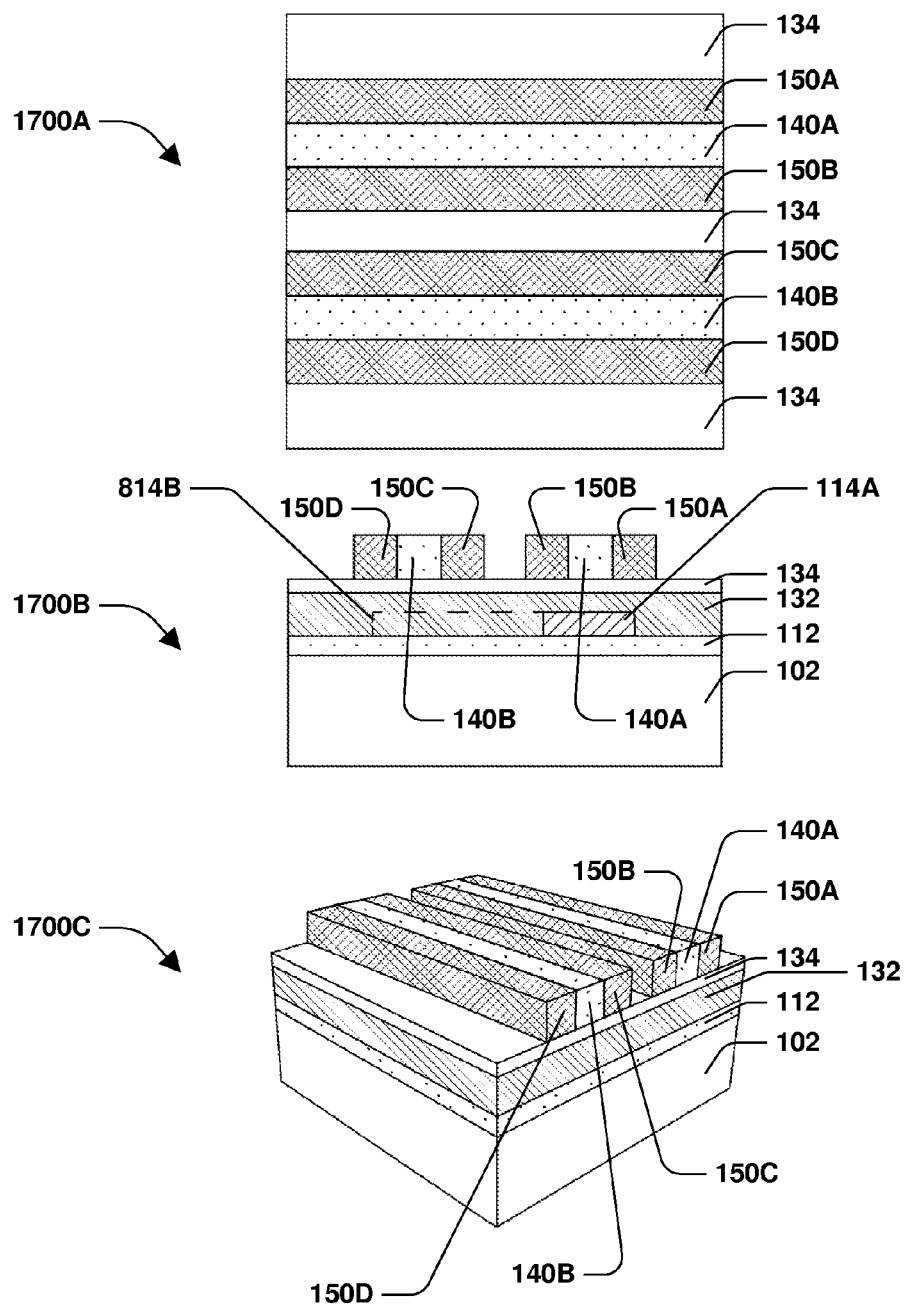
FIG. 17 illustrates various views of an example line end space structure during formation, according to some embodiments.

FIG. 17 illustrates various views of an example line end space structure during formation, according to some embodiments. For example, 1700A is a top-down view of an example line end space structure during formation, according to some embodiments. In some embodiments, at least some of the spacer region 150 is removed. For example, the spacer region 150 is removed in a vertical manner based on an anisotropic etch, for example. Accordingly, the spacer region 150 between at least some of the patterned second PR regions is removed. In some embodiments, the spacer region 150 between at least some of the patterned second PR regions is associated with a third line location. In some embodiments, at least some of the spacer region 150 between the first patterned second PR region 140A and the second patterned second PR region 140B is removed. For example, the removed spacer region 150 between the first patterned second PR region 140A and the second patterned second PR region 140B is above the third line location. For example, the third line location is between the first patterned second PR region 140A and the second patterned second PR region 140B. Additionally, the spacer region 150 above at least some of the patterned second PR regions is removed. For example, at least some of the spacer region 150 above at least one of the first patterned second PR region 140A or the second patterned second PR region 140B is removed. For example, the spacer region 150 above at least one of the first patterned second PR region 140A or the second patterned second PR region 140B is removed such that the spacer region 150 is flush with the second PR regions 140A and 140B. In this way, the spacer region 150 is formed to comprise a first patterned spacer region 150A, a second patterned spacer region 150B, a third patterned spacer region 150C, and a fourth patterned spacer region 150D. In some embodiments, a gap associated with a third line location is between the second patterned spacer region 150B and the third patterned spacer region 150C. For example, the gap is above the third line location. Accordingly, at least some of the second sacrificial HM region 134 is exposed during removal of at least some of the spacer region 150, for example. Additionally, 1700B is a cross-sectional view of an example line end space structure during formation, according to some embodiments. In some embodiments, respective patterned spacer regions 150A, 150B, 150C, and 150D are associated with a distance between metal lines, at least because one or more lines are to be formed at locations associated with 140A and 140B, for example. Additionally, 1700C is a perspective view of an example line end space structure during formation, according to some embodiments.

Figure 18:
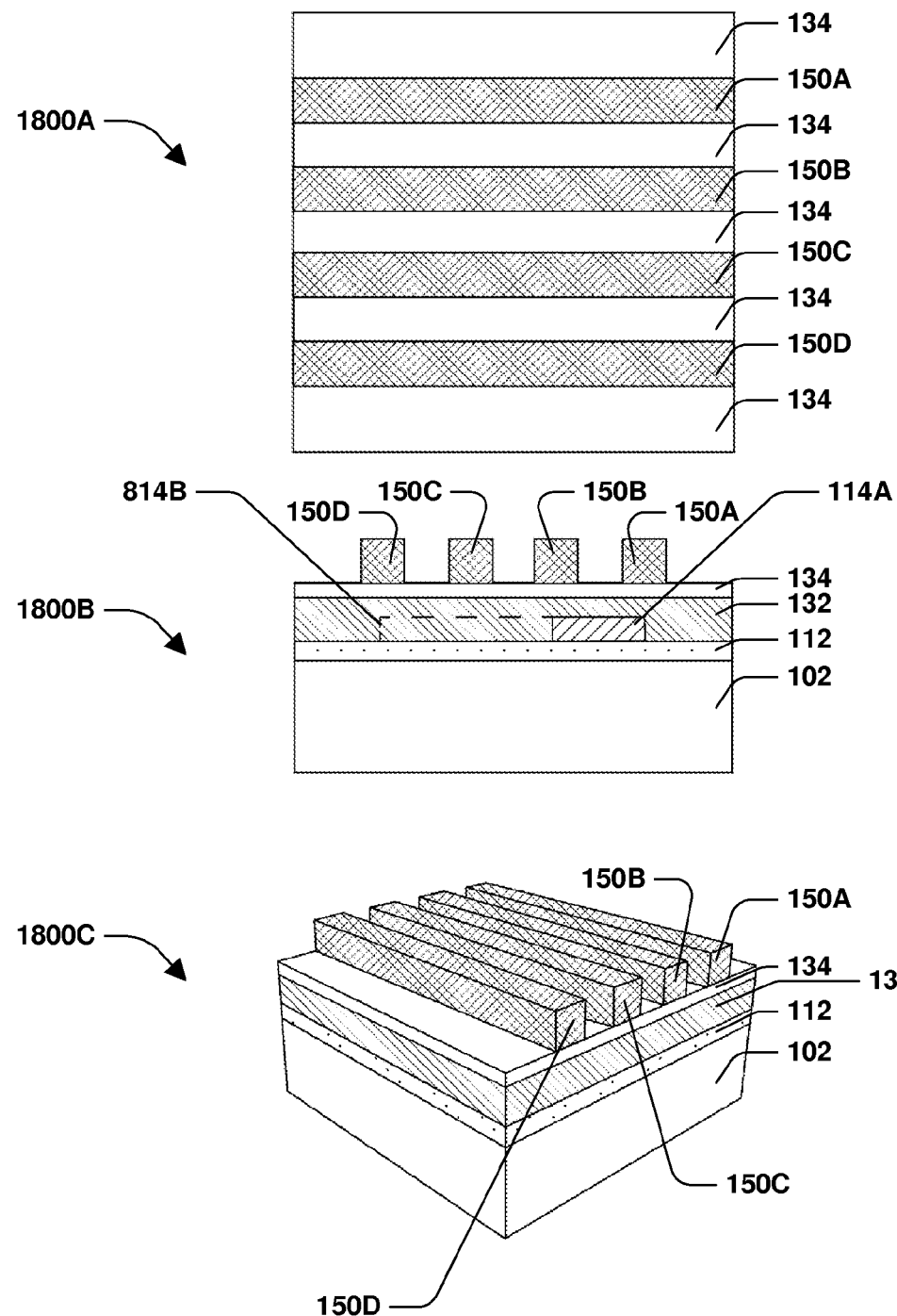
FIG. 18 illustrates various views of an example line end space structure during formation, according to some embodiments.

FIG. 18 illustrates various views of an example line end space structure during formation, according to some embodiments. For example, 1800A is a top-down view of an example line end space structure during formation, according to some embodiments. In some embodiments, at least some of the second PR region 140 is removed. For example, the second PR region 140 comprises the first patterned second PR region 140A and the second patterned second PR region 140B. Therefore, at least one of the first patterned second PR region 140A or the second patterned second PR region 140B is removed, according to some embodiments. Accordingly, at least some of the second sacrificial HM region 134 is exposed during removal of at least some of the second PR region 140, for example. Additionally, 1800B is a cross-sectional view of an example line end space structure during formation, according to some embodiments. It will be appreciated that respective patterned spacer regions 150A, 150B, 150C, and 150D are associated with a run-to-run space between one or more rows of metal lines, in some embodiments. For example, respective metal lines are associated with one or more line locations. In some embodiments, respective patterned spacer regions are associated with separating one or more rows of metal lines. Additionally, 1800C is a perspective view of an example line end space structure during formation, according to some embodiments.

Figure 19:
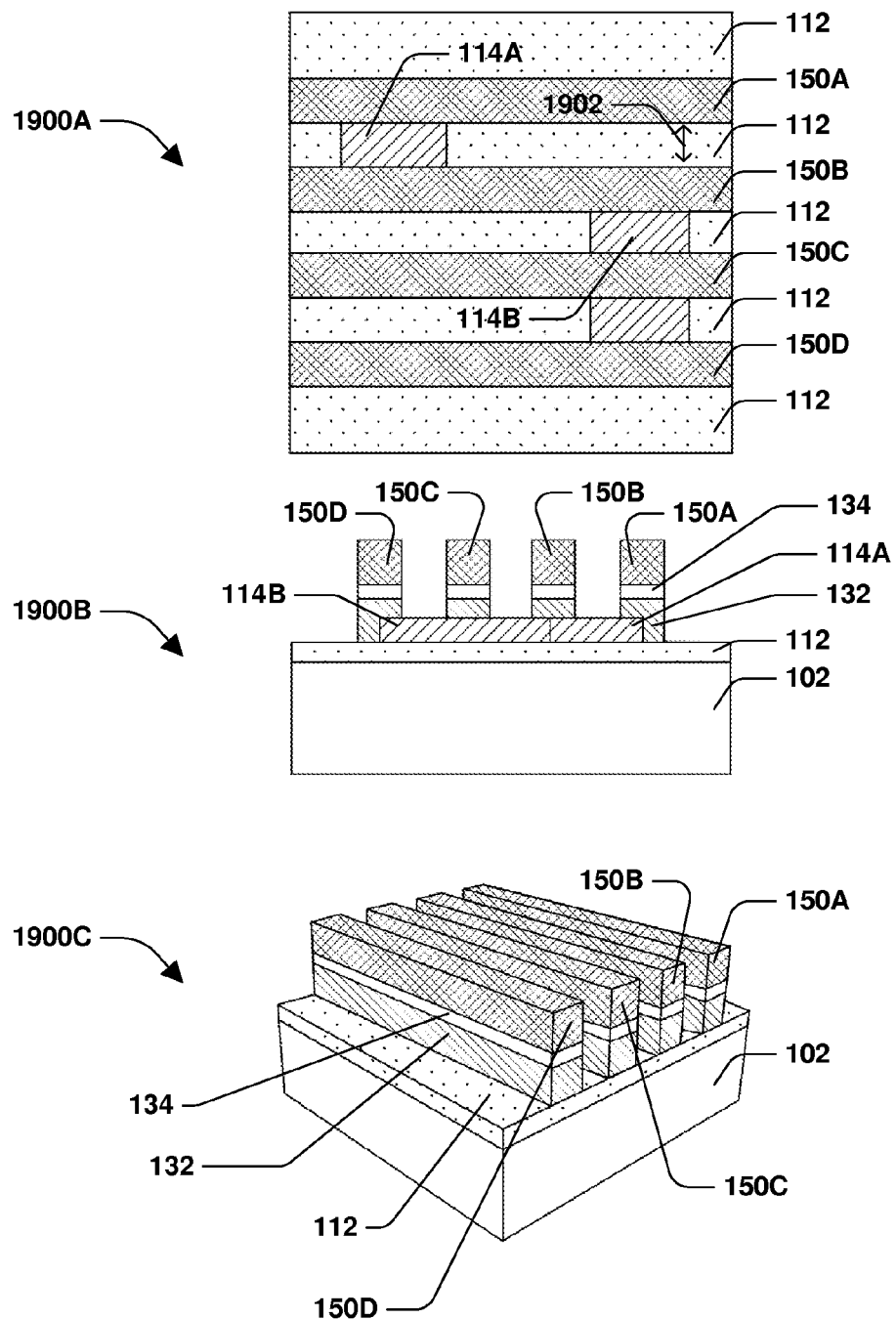
FIG. 19 illustrates various views of an example line end space structure during formation, according to some embodiments.

FIG. 19 illustrates various views of an example line end space structure during formation, according to some embodiments. For example, 1900A is a top-down view of an example line end space structure during formation, according to some embodiments. In some embodiments, at least some of the second sacrificial HM region 134 is removed. For example, at least some of the second sacrificial HM region 134 not associated with or covered by the spacer region 150 is removed. Similarly, at least some of the first sacrificial HM region 132 is removed. For example, at least some of the first sacrificial HM region 132 not associated with or covered by the spacer region 150 is removed. In this way, at least some of at least one of the second sacrificial HM region 134 not associated with the spacer region 150 or the first sacrificial HM region 132 not associated with the spacer region 150 is removed. For example, a first patterned spacer region 150A, a second patterned spacer region 150B, a third patterned spacer region 150C, and a fourth patterned spacer region 150D cover one or more portions of at least one of the second sacrificial HM region 134 or the first sacrificial HM region 132. Accordingly, such covered portions are thus not removed. In this way, at least one of the first patterned second HM region 114A, the second patterned second HM region 114B, the first HM region 112, and the spacer region 150 are exposed. Additionally, 1900B is a cross-sectional view of an example line end space structure during formation, according to some embodiments. In some embodiments, at least some of the second HM region 114 is exposed. For example, the second HM region 114 comprises the first patterned second HM region 114A and the second patterned second HM region 114B. It will be appreciated that the spacer region 150 comprises a first patterned spacer region 150A, a second patterned spacer region 150B, a third patterned spacer region 150C, and a fourth patterned spacer region 150D, for example. Accordingly, the first patterned spacer region 150A is associated with or covers a portion of the second sacrificial HM region 134 and a portion of the first sacrificial HM region 132, as seen in 1900B. Accordingly, at least some of the first HM region 112 is exposed during removal of at least some of at least one of the second sacrificial HM region 134 or the first sacrificial HM region 132, for example. Additionally, 1900C is a perspective view of an example line end space structure during formation, according to some embodiments. For example, a first stack is associated with the first patterned spacer region 150A. In some embodiments, the first stack is associated with the first patterned spacer region 150A above the second sacrificial HM region 134, the second sacrificial HM region 134 above the first sacrificial HM region 132, and at least some of the first sacrificial HM region 132 above at least some of the first patterned second HM region 114A.

Figure 20:
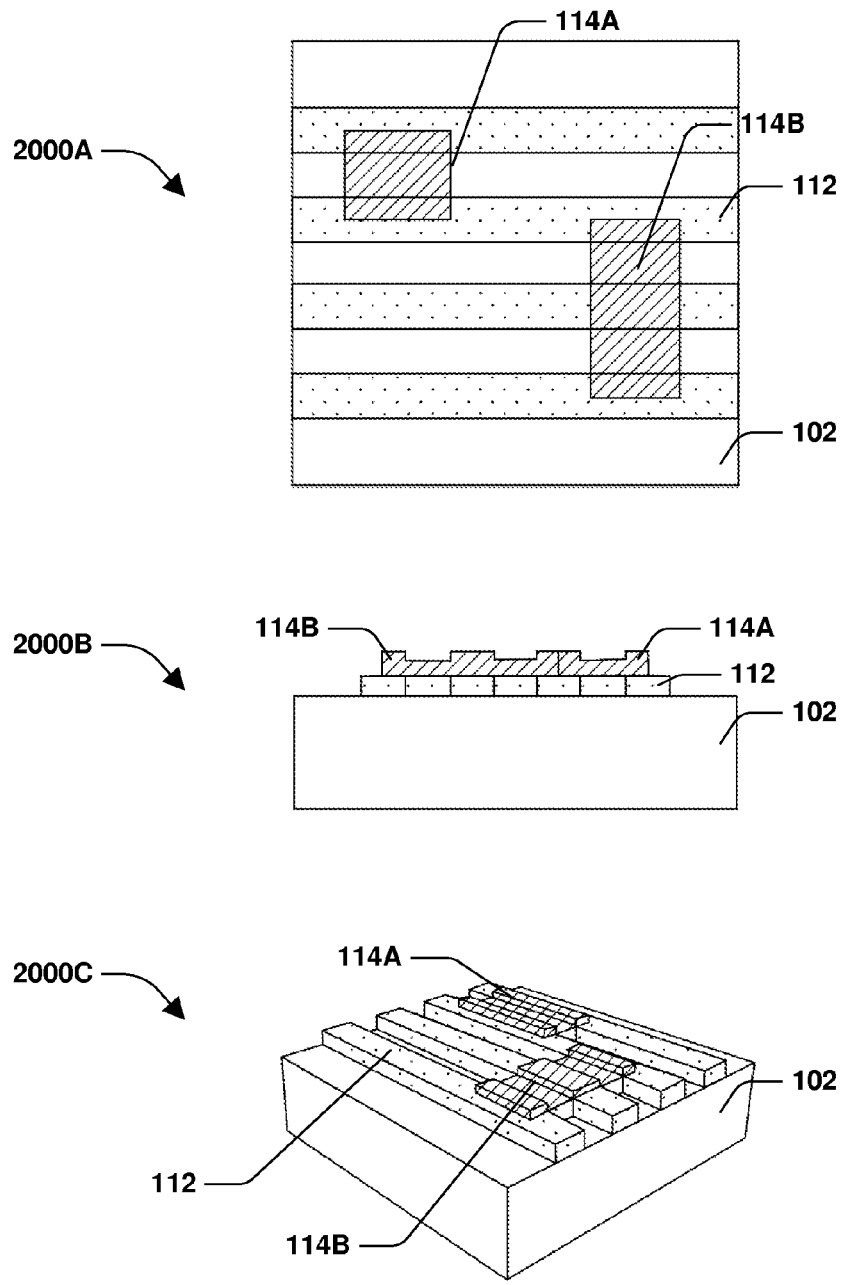
FIG. 20 illustrates various views of an example line end space structure during formation, according to some embodiments.

FIG. 20 illustrates various views of an example line end space structure during formation, according to some embodiments. For example, 2000A is a top-down view of an example line end space structure during formation, according to some embodiments. In some embodiments, at least some of at least one of the spacer region 150, the second sacrificial HM region 134, the first HM region 112, or the first sacrificial HM region 132 is removed. For example, the spacer region 150 and the second sacrificial HM region 134 are removed. Additionally, at least some of the first HM region 112 not associated with or covered by the first sacrificial HM region 132 is removed. In some embodiments, the first sacrificial HM region 132 is removed. In some embodiments, at least some of the first HM region 112 is removed. For example, at least some of the first HM region 112 not associated with or covered by one or more patterned second HM regions is removed. For example, at least some of the first HM region 112 not associated with at least one of the first patterned second HM region 114A or the second patterned second HM region 114B is removed. In this way, a thickness associated with the first HM region 112 is reduced, for example. Accordingly, at least one of the first patterned second HM region 114A, the second patterned second HM region 114B, the first HM region 112, or the base region 102 is exposed. Additionally, 2000B is a cross-sectional view of an example line end space structure during formation, according to some embodiments. Additionally, 2000C is a perspective view of an example line end space structure during formation, according to some embodiments.

Figure 21:
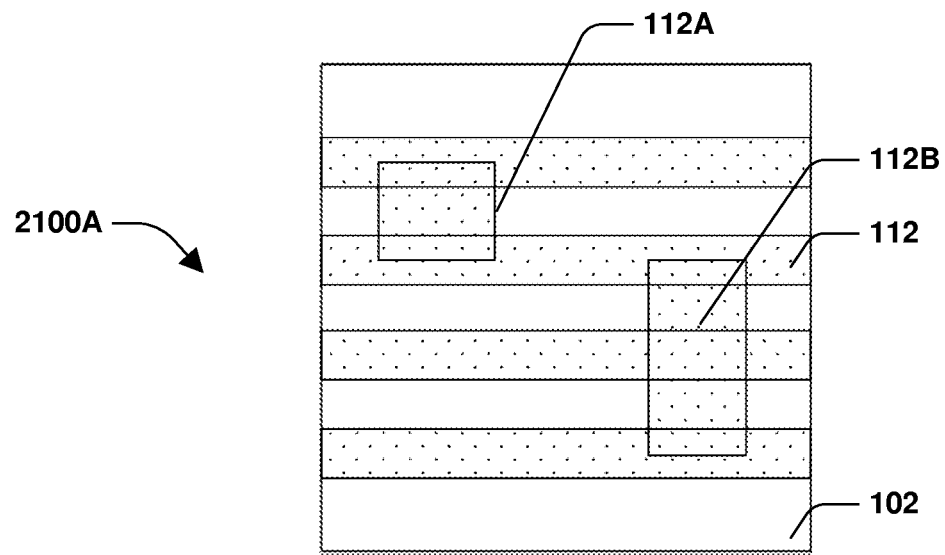
FIG. 21 illustrates various views of an example line end space structure during formation, according to some embodiments.
Figure 21:
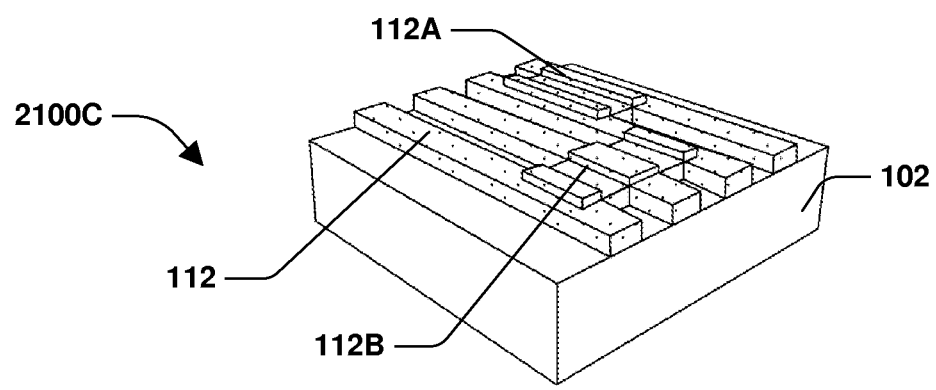

FIG. 21 illustrates various views of an example line end space structure during formation, according to some embodiments. For example, 2100A is a top-down view of an example line end space structure during formation, according to some embodiments. In some embodiments, one or more patterned second HM regions are removed. For example, at least one of the first patterned second HM region 114A or the second patterned second HM region 114B is removed. In this way, the first HM region 112 is exposed. Additionally, one or more line end space structures are exposed. For example, a first line end space structure 112A and a second line end space structure 112B are formed. It will be appreciated that respective line end space structures are formed based on one or more patterned second HM regions, such as 114A or 114B. For example, at least one of the first line end space structure 112A or the second line end space structure 112B is formed by removing patterned second HM regions. For example, at least one of the first patterned second HM region 114A or the second patterned second HM region 114B is removed to form 112A and 112B, respectively. Additionally, respective line end space structures are formed based on one or more EE space patterns associated with respective patterned second HM regions. In some embodiments, the first HM region 112 comprises the first line end space structure 112A and the second line end space structure 112B. Additionally, 2100C is a perspective view of an example line end space structure during formation, according to some embodiments.

FIG. 22 illustrates various views of an example line end space structure during formation, according to some embodiments. For example, 2200A is a top-down view of an example line end space structure during formation, according to some embodiments. In some embodiments, at least some of the base region 102 is removed. For example, at least some of the base region 102 not associated with the first HM region 112 is removed. In some embodiments, at least some of the base region 102 not associated with the first line end space structure 112A or the second line end space structure 112B is removed. For example, base region 102 not covered by the first HM region 112 is removed, such as at 2202 or 2204. In some examples, a portion of base region 102 is removed at 2202, at least because the first HM region 112 does not cover 2202. In some embodiments, one or more metal lines are formed within one or more portions of the base region 102 not associated with the first HM region 112. For example 2202 and 2204 are removed, and one or more corresponding metal lines are formed. Additionally, 2200C is a perspective view of an example line end space structure during formation, according to some embodiments. In some embodiments, the second line end space structure 112B is configured to separate a first metal line at 2204 from a second metal line at 2202. In some embodiments, the first line end space structure 112A is configured to separate one or more metal lines in a similar fashion. For example, a first metal line is formed on a first side of a line end space structure 112B, such as at 2204. Additionally, a second metal line is formed on a second side of the line end space structure 112B, such as 2202.

Figure 23:
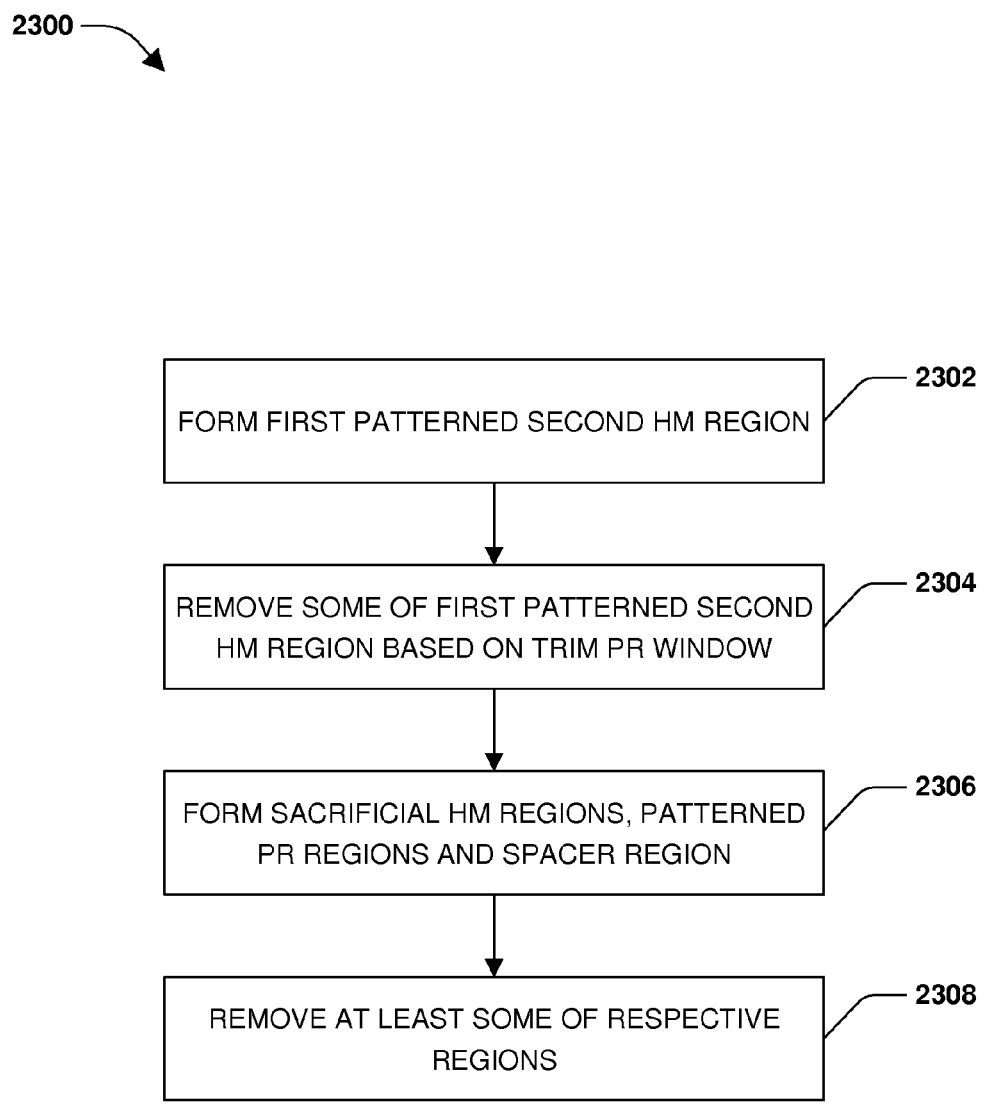
FIG. 23 is a flow diagram of an example method for forming a line end space structure, according to some embodiments.

FIG. 23 is a flow diagram of an example method 2300 for forming a line end space structure, according to some embodiments. At 2302, the method 2300 comprises forming a first patterned second HM region. At 2304, the method 2300 comprises removing some of the first patterned second HM region based on a trim PR window. At 2306, the method 2300 comprises forming sacrificial HM regions, patterned PR regions, and a spacer region. At 2308, the method 2300 comprises removing at least some of the respective regions.

One or more techniques or systems for forming a line end space structure are provided herein. In some embodiments, a line end space structure is formed at a back end of the line (BEOL). In some embodiments, an end-to-end (EE) space pattern is formed first, for example. In some embodiments, a second hard mask (HM) region associated with a line end space structure is patterned. In some embodiments, at least some of the patterned second HM region is removed, thus reducing an EE space associated with the patterned second HM region. For example, at least some of the patterned second HM region is removed based on a window in a trim photo resist (PR) region. In some embodiments, the second HM region is above a first HM region. Additionally, sacrificial HM regions are formed above at least some of the patterned second HM region. Spacers are formed above at least one of the sacrificial HM regions to facilitate metal line formation. Accordingly, respective sacrificial HM regions are removed to expose the patterned second HM region. In this way, a line end space structure is formed, based on the patterned second HM region.

According to some aspects, a method for forming a line end space structure is provided, comprising forming a first patterned second hard mask (HM) region based on a first patterned first photo resist (PR) region, the first patterned second HM region associated with a first pattern location. In some embodiments, the method comprises removing at least some of the first patterned second HM region based on a trim PR window. In some embodiments, the method comprises forming at least one of a first sacrificial HM region, a second sacrificial HM region, a first patterned second PR region, a second patterned second PR region, or a spacer region. In some embodiments, the method comprises removing at least some of at least one of the spacer region, the first patterned second PR region, the second patterned second PR region, the first HM region not associated with the first sacrificial HM region, first sacrificial HM region, or the first HM region not associated with the first patterned second HM region.

According to some aspects, a method for forming a line end space structure is provided, comprising forming a first patterned second hard mask (HM) region based on a first patterned first photo resist (PR) region, the first patterned second HM region associated with a first pattern location. In some embodiments, the method comprises forming a trim PR region above at least some of at least one of the first patterned second HM region or a first HM region. In some embodiments, the method comprises forming a window within the trim PR region. In some embodiments, the method comprises removing at least some of the first patterned second HM region based on the window. In some embodiments, the method comprises removing the trim PR region. In some embodiments, the method comprises forming at least one of a first sacrificial HM region, a second sacrificial HM region, or a spacer region. In some embodiments, the method comprises removing at least some of at least one of the spacer region, the second sacrificial HM region not associated with the spacer region, the first sacrificial HM region not associated with the spacer region, the second sacrificial HM region, the first HM region not associated with the first sacrificial HM region, the first sacrificial HM region, the first HM region not associated with the first patterned second HM region, the first patterned second HM region, or the base region not associated with the first HM region.

According to some aspects, a method for forming a line end space structure is provided, comprising forming one or more patterned second hard mask (HM) regions based on one or more corresponding patterned first photo resist (PR) regions, respective patterned second HM regions associated with one or more pattern locations. In some embodiments, the method comprises removing at least some of at least one of the patterned second HM regions. In some embodiments, the method comprises forming at least one of a first sacrificial HM region, a second sacrificial HM region, or a spacer region. In some embodiments, the method comprises removing at least some of at least one of the spacer region, the second sacrificial HM region not associated with the spacer region, the first sacrificial HM region not associated with the spacer region, the second sacrificial HM region, the first HM region not associated with the first sacrificial HM region, the first sacrificial HM region, the first HM region not associated with at least one of the patterned second HM regions, the patterned second HM regions, or the base region not associated with the first HM region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the base region, first hard mask (HM) region, second HM region, first photo resist (PR) region, first patterned first PR region, trim PR region, window, first patterned second HM region, first sacrificial HM region, second sacrificial HM region, second PR region, first patterned second PR region, second patterned second PR region, spacer region, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, such as spin coating, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A method, comprising:
   patterning a hard mask (HM) region to form a patterned HM region above a base region;
   forming a trim photo resist (PR) region above the patterned HM region;
   forming a window within the trim PR region to expose a portion of the patterned HM region; and
   removing the portion of the patterned HM region exposed through the window.

2. The method of claim 1, comprising:
   patterning a second HM region, between the base region and the HM region, using a second portion of the patterned HM region not exposed through the window to form a patterned second HM region.

3. The method of claim 2, comprising
   removing at least some of the base region not covered by the patterned second HM region to form a line end space structure within the base region.

4. The method of claim 1, the patterning a HM region comprising:
   forming a PR region above the HM region;
   patterning the PR region to form a patterned PR region; and
   patterning the HM region using the patterned PR region.

5. The method of claim 1, comprising:
   removing the trim PR region to expose a second portion of the patterned HM region not exposed through the window.

6. The method of claim 5, comprising:
   forming a sacrificial HM region above the second portion of the patterned HM region.

7. The method of claim 6, comprising:
   forming a second sacrificial HM region above the sacrificial HM region.

8. The method of claim 7, comprising:
   forming a PR region above the second sacrificial HM region; and
   patterning the PR region to form a patterned PR region.

9. The method of claim 8, comprising:
   forming a spacer region above the patterned PR region and above the second sacrificial HM region.

10. The method of claim 9, wherein:
    the patterning the PR region exposes a portion of the second sacrificial HM region; and
    the forming a spacer region comprises forming the spacer region above the portion of the second sacrificial HM region.

11. The method of claim 9, the forming a spacer region comprising:
    forming the spacer region conformally above the patterned PR region and the second sacrificial HM region.

12. The method of claim 8, comprising:
    forming a spacer region adjacent the patterned PR region.

13. The method of claim 12, comprising:
    forming a second spacer region adjacent the patterned PR region, the second spacer region diametrically opposite the spacer region relative to the patterned PR region; and
    removing the patterned PR region between the spacer region and the second spacer region.

14. The method of claim 12, comprising:
    removing a portion of the second sacrificial HM region not covered by the spacer region; and
    removing a portion of the sacrificial HM region not covered by the spacer region to expose a portion of the second portion of the patterned HM region.

15. A method for forming a line end space structure, comprising:
   forming a hard mask (HM) region above a base region;
   forming a second HM region above the HM region;
   patterning the second HM region to form a patterned second HM region;
   forming a spacer region above the HM region;
   removing at least some of the HM region at least one of not covered by the patterned second HM region or not covered by the spacer region to form a patterned HM region; and
   removing at least some of the base region not covered by the patterned HM region to form the line end space structure.

16. The method of claim 15, the removing at least some of the base region comprising:
   removing at least some of the base region not covered by the patterned HM region to form a metal line trench in which a metal line is formed.

17. The method of claim 15, comprising:
   forming a trim photo resist (PR) region above the patterned second HM region;
   forming a window within the trim PR region to expose a portion of the patterned second HM region; and
   removing the portion of the patterned second HM region to reduce a length of the patterned second HM region.

18. The method of claim 17, wherein the window further exposes a portion of the HM region.

19. A method, comprising:
   forming a hard mask (HM) region above a base region;
   forming a second HM region above the HM region;
   patterning the second HM region to form a patterned second HM region;
   forming a trim photo resist (PR) region above the patterned second HM region;
   forming a window within the trim PR region to expose a portion of the patterned second HM region; and
   removing the portion of the patterned second HM region exposed through the window.

20. The method of claim 19, comprising:
   patterning the HM region using a second portion of the patterned second HM region not exposed through the window to form a patterned HM region; and
   removing at least some of the base region not covered by the patterned HM region to form a line end space structure within the base region.

\* \* \* \* \*